United States Patent
Azakami et al.

(10) Patent No.: US 7,054,395 B2
(45) Date of Patent: May 30, 2006

(54) AUTOMATIC GAIN CONTROL FOR DIGITAL DEMODULATION APPARATUS

(75) Inventors: Hiroshi Azakami, Ibaraki (JP); Takaaki Konishi, Ibaraki (JP); Hisaya Kato, Soraku-gun (JP); Naoya Tokunaga, Moriguchi (JP); Hiroaki Ozeki, Osaka (JP); Kazuya Ueda, Hirakata (JP)

(73) Assignee: Matsushita Electric Industrial Co., Ltd., Osaka-Fu (JP)

( * ) Notice: Subject to any disclaimer, the term of this patent is extended or adjusted under 35 U.S.C. 154(b) by 1045 days.

(21) Appl. No.: 09/853,682

(22) Filed: May 14, 2001

(65) Prior Publication Data

US 2002/0003836 A1    Jan. 10, 2002

(30) Foreign Application Priority Data

May 15, 2000    (JP)    ............................. 2000-141958

(51) Int. Cl.
    *H04L 27/08*    (2006.01)
(52) U.S. Cl. ........................................ 375/345; 375/317
(58) Field of Classification Search ............. 455/232.1, 455/234.1, 245.1, 246.1, 266, 234.2; 375/345, 375/231, 316, 262, 346; 348/678, 725, 726; 333/128; 708/323; 329/304
    See application file for complete search history.

(56) References Cited

U.S. PATENT DOCUMENTS

| 4,628,507 A | 12/1986 | Otani |
| 5,287,556 A | 2/1994 | Cahill |
| 5,293,247 A | 3/1994 | Ganse |
| 5,408,698 A | 4/1995 | Serizawa et al. |
| 5,563,916 A * | 10/1996 | Scarpa ........................ 375/345 |
| 5,805,241 A * | 9/1998 | Limberg ...................... 348/725 |
| 6,070,062 A * | 5/2000 | Yoshida et al. ........... 455/234.1 |
| 6,081,565 A * | 6/2000 | Marandi et al. ............ 375/345 |
| 6,121,828 A | 9/2000 | Sasaki |
| 6,239,848 B1 * | 5/2001 | Mycynek et al. ........... 348/678 |
| 6,459,458 B1 * | 10/2002 | Balaban ...................... 348/678 |
| 6,650,878 B1 * | 11/2003 | Abe et al. ................. 455/232.1 |
| 6,879,630 B1 * | 4/2005 | Kokuryo et al. ............ 375/231 |

FOREIGN PATENT DOCUMENTS

| EP | 0 562 568 | 9/1993 |
| JP | 11-331300 | 11/1999 |

OTHER PUBLICATIONS

Direct conversion-how to make it work in TV tuners; Aschwanden, F.; Consumer Electronics, IEEE Transactions on vol. 42, Issue 3, Aug. 1996 pp. :729-738.*

* cited by examiner

*Primary Examiner*—Jay K. Patel
*Assistant Examiner*—Jacob Meek
(74) *Attorney, Agent, or Firm*—Wenderoth, Lind & Ponack, L.L.P.

(57) ABSTRACT

A digital demodulation apparatus automatically controls gain based on a state of receiving a digital modulated signal. The digital demodulation apparatus amplifies a digital modulated signal wave received through the air with the gain automatically controlled so as to have a predetermined amplitude. In the digital demodulation apparatus, a receive level variation detector detects receive level variation, an amount of noise components of the received digital signal wave. A gain controller 15 controls the gain with a receive level variation adaptive control signal based on the detected receive level variation, the amount of noise components.

20 Claims, 30 Drawing Sheets

Fig. 27  Pror Art

AUTOMATIC GAIN CONTROL FOR DIGITAL DEMODULATION APPARATUS

BACKGROUND OF THE INVENTION

1. Field of the Invention

The present invention relates to digital demodulation apparatuses that demodulate a digital modulated signal wave transmitted through the air and, more specifically, to a digital demodulation apparatus capable of carrying out automatic gain control for adjusting gain according to the state of receiving the digital modulated signal.

2. Description of the Background Art

In FIG. 25, the structure of a conventional VSB demodulation apparatus is schematically shown. A VSB demodulation apparatus DSc includes an antenna 10, a station-selection tuner 11, a down-converter 12, an AGC amplifier 13, an A/D converter 14, an AGC 15, a Hilbert filter 16, a detector 17, an interpolation filter 18, a roll-off filter 19, a waveform equalizer 1000, an error corrector 1001, and a C/N detector 1002.

The antenna 10 receives VSB modulated signal waves Sb coming from broadcasting stations over a plurality of channels. Of these VSB modulated signal waves Sb received through the antenna 10, the station-selection tuner 11 selects the one to which it is tuned. The down-converter 12 is connected to the station-selection tuner 11 to convert the frequency of the VSB modulated signal received from the station-selection tuner 11 into a desired intermediate frequency (IF).

The AGC amplifier 13 is a gain control amplifier (automatic gain control amplifier) for adjusting the gain of an IF signal outputted from the down-converter 12 to a desired magnitude. The A/D converter 14 converts the frequency-converted, gain-adjusted analog VSB modulated signal outputted from the AGC amplifier 13 into a digital signal, with a frequency twice a symbol frequency.

The AGC 15 is a gain controller (automatic gain controller) for calculating an average value of amplitudes of the digital VSB modulated signal (hereinafter referred to simply as "VSB modulated signal") Svsb and generating a digital signal having a desired amplitude for normal operation of the VSB demodulation apparatus. This digital signal is supplied to the AGC amplifier 13 as a control signal Sc. Based on the control signal Sc from the AGC 15, the AGC amplifier 13 adjusts the amplitude of the VSB modulated signal Svsb received from the down-converter 12, and then outputs the resultant signal to the A/D converter 14. As such, the AGC amplifier 13, the A/D converter 14, and the AGC 15 form a feed-back loop circuit, and obtained therefrom is the VSB modulated signal Svsb having the desired amplitude.

The Hilbert filter 16 extracts quadrature components of the VSB modulated signal Svsb received from the A/D converter 14, and outputs a quadrature-component signal to the detector 17. Based on the VSB modulated signal Svsb outputted from the A/D converter 14 and the quadrature-component signal outputted from the Hilbert filter 16, the detector 17 demodulates and corrects a frequency error between the received VSB modulated signal Svsb and a signal from an oscillator in the station-selection tuner 11. The detector 17 then generates a baseband signal.

The interpolation filter 18 converts, based on clock frequency data for the apparatus, the baseband signal outputted from the detector 17 into symbol-rate frequency data.

The roll-off filter 19 extracts, from the symbol-rate frequency data received from the interpolation filter 18, a low-frequency domain signal at a desired roll-off ratio. The waveform equalizer 1000 eliminates distortion caused by a transmission path from the symbol-rate frequency signal in low frequency domain outputted from the roll-off fitter 19 for equalizing the waveform of the signal. The error corrector 1001 corrects an error caused by the transmission path and occurring in the symbol-rate frequency signal in low frequency domain with its waveform equalized by the waveform equalizer 1000. Thus, a transport stream of the VSB modulated signal is demodulated. The error corrector 1001 outputs an error-correction signal indicative of the number of error corrections. The demodulated transport stream is outputted to an MPEG decoder (not shown) in the following stage. The C/N detector 1002 calculates, based on the error-correction signal outputted from the error corrector 1001, the amount of noise components on the transmission path to find a C/N ratio.

In FIG. 26, the detailed structure of the above AGC 15 is shown. The AGC 15 includes an amplitude calculator 21, an averaging filter 22, an error detector 23, a loop filter 24, a PWM calculator 25, a low-pass filter 26, and an operational amplifier 27. As stated above, the AGC 15 calculates an average amplitude of the VSB modulated signal Svsb using the output signal from the A/D converter 14, generates a control signal so that the A/D converter 14 is supplied with a digital signal having a desired amplitude for normal operation of the system. The AGC 15 outputs the control signal to the AGC amplifier 13.

First, the amplitude calculator 21 calculates an absolute value of the VSB modulated signal Svsb outputted from the A/D converter 14 for finding the amplitude of that signal. The amplitude calculator 21 then outputs an amplitude signal indicative of the found amplitude. Based on the amplitude signal received from the amplitude calculator 21, the averaging filter 22 calculates an average value of the amplitudes of the VSB modulated signal Svsb, and outputs an average amplitude signal. Based on the average amplitude signal outputted from the average filter 22, the error detector 23 detects an error between the actual average amplitude value of the VSB modulated signal Svsb and a desirable amplitude value thereof for normal operation of the entire VSB demodulation apparatus. The error detector 23 then outputs an average amplitude error signal.

Based on the average amplitude error signal received from the error detector 23, the loop filter 24 integrates the detected error to generate a stabilization signal for stabilizing the entire loop of the AGC 15. The PWM calculator 25 converts an output from the loop filter 24 into a square wave indicating error information by a ratio between 0s and 1s. The low-pass filter 26 extracts low-frequency components from the square wave supplied by the PWM calculator 25 for stabilizing the wave at a desired level. To adjust loop gain in the entire AGC 15, the operational amplifier 27 amplifies an output from the low-pass filter 26 to a level suitable for the AGC amplifier 13, and then supplies the amplified output to the AGC amplifier 13.

In FIG. 27, the detailed structure of the above averaging filter 22 is shown. The averaging filter 22 includes multipliers 31a and 31b, a first coefficient provider 32, a second coefficient provider 33, an adder 34, and a delay unit 35. The first coefficient provider 32 holds the inverse of the predetermined number of times of averaging as a first average coefficient K for output as requested. The second coefficient provider 33 holds a value obtained by subtracting the first average coefficient K from 1, that is, "1−K", as a second average coefficient for output as requested.

As stated above, the averaging filter 22 averages the amplitudes detected by the amplitude calculator 21. Thus, the multiplier 31a multiples the amplitude signal received from the amplitude calculator 21 by the first average coefficient K received from the first coefficient provider 32, and outputs the multiplication result to the adder 34. The adder 34 adds the multiplication result received from the multiplier 31a and an output from the multiplier 31b together, and outputs the addition result to the error detector 23 and the delay unit 35. The delay unit 35 delays the addition result received from the adder 34 by one control cycle for output. The multiplier 31b multiples the addition result delayed by one control cycle by the second average coefficient "1−K" received from the second coefficient provider 33, and outputs the result to the adder 34.

Here, one control cycle is one sequence of a control process that is successively carried out in the VSB demodulation system DSc and its components. In other words, the control cycle is a time period required for carrying out a single control process, that is, a period from the start of one control cycle to the start of a next control cycle. Throughout this specification, the control cycle is represented as t, and the control cycle period is as Pt. In other words, with reference to the control cycle t, a control cycle that precedes the control cycle t is represented as t−n (n is a natural number), while the one that follows the control cycle t is as t+n. Similarly, the control cycle period is represented as Pt+n or Pt−n. As is evident from the above, the control cycle t can be regarded as a parameter indicating a relative time.

As such, two values obtained by multiplying the average amplitude signal outputted from the multiplier 31a by the first average coefficient K for the control cycle t and the previous control cycle t−1 are added together by the adder 34 for every control cycle t. Thus, the average value of the amplitudes of the VSB modulated signal can be obtained.

With reference to FIG. 27, the processing carried out by the averaging filter 22 is described. The amplitude signal outputted from the amplitude calculator 21 to the multiplier 31a is X1(t), and the average amplitude signal outputted from the adder 34 is X2(t). In FIG. 27, a case where the control cycle t is 2 is illustrated. For convenience of description, the control cycle t is hereinafter simply referred to as "t" unless otherwise required.

The following signal relation holds as represented by the following equation (1).

$$X2(t)=K \times X1(t)+(1-K) \times X2(t-1)\} \qquad (1)$$

As apparent from the equation (1), the average times are set to 300, the average coefficient K becomes 1/300. In this case, the signal X1 multiplied by K (1/300) and the integration sum thereof multiplied by 299/300 produce the signal X2.

The detailed structure of the above loop filter 24 is shown in FIG. 28. The loop filter 24 includes an integral coefficient provider 41, a multiplier 42, an adder 43, and a delay unit 44. The integral coefficient provider 41 holds an integral coefficient A indicative of loop sensitivity of the AGC loop, and outputs the integral coefficient A as required. The multiplier 42 multiplies the average amplitude signal X2(t) received from the error detector 23 by the integral coefficient A received from the integral coefficient provider 41 to produce A×X2(t) for output to the adder 43. For convenience of description, the average amplitude signal X2 is hereinafter simply referred to as "X2" unless otherwise required. The adder 43 adds A×X2(t) received from the multiplier 42 and X2(t−1) received from the delay unit 44 together to produce A×X2(t)+X2(t−1) for output to the PWM calculator 25 as X3(t) and to the delay unit 44.

When t=1, X2(t−1) is outputted from the delay unit 44 is 0. Therefore, A×X2(t) is outputted from the adder 43 to the delay unit 44 and to the PWM calculator 25 as the stabilization signal X3(t).

When t=2, A×X2(t)+X2(t−1) is outputted to the delay unit 44 and to the PWM calculator 25 as the stabilization signal X3(t). The procedure goes similarly thereafter.

Therefore, the following signal relation holds as represented by the following equation (2).

$$X3(t)=\Sigma\{A \times X2(t)\} \qquad (2)$$

The detailed structure of the above PWM calculator 25 is shown in FIG. 29. The PWM calculator 25 includes an overflow adder 51 and a delay unit 52.

Note that, in a case where the signal X3 outputted from the loop filter 24 is a digital signal having a width of n bits (n is a predetermined natural number), the PWM calculator 25 outputs 1 when the output from the overflow adder 51 is over n bits and otherwise outputs 0, in one control cycle t. Thus, the ratio between 0s and 1s in the square wave becomes proportional to the signal X3 outputted from the loop filter 24.

Next, with reference to FIG. 30, the main operation of the VSB demodulation apparatus DSc is described. When powered on to start operation, the VSB demodulation system DSp1 first starts subroutine step #100, "receiving of an analog VSB modulated signal".

In step #100, from the VSB modulated signals over a plurality of channels received through the antenna, the station-selection tuner 11 selects a channel of a receive signal to which it is tuned. The analog VSB modulated signal of the selected channel is received. Then, the procedure goes to a next step #200, "down-conversion" subroutine.

In step #200, the analog VSB modulated signal received in step #100 is converted by the down-converter 12 into an IF signal having a desired frequency. Then, the procedure goes to a next step #300, "amplification" subroutine.

In step #300, the IF signal generated in step #200 is amplified with predetermined gain by the AGC amplifier 13. Then, the procedure goes to a next step #400, "A/D conversion" subroutine.

In step #400, the analog VSB modulated signal, which is the IF signal amplified in step #300, is converted by the A/D converter 14 into a digital VSB modulated signal. Then, the procedure goes to a next step #600, "Hilbert filtering" subroutine.

In step #600, based on the VSB modulated signal Svsb generated in step #400, the Hilbert filter 16 generates a quadrature-component signal. Then, the procedure goes to a next step #700, "detection" subroutine.

In step #700, the detector 17 detects the VSB modulated signal Svsb generated in step #400 with the quadrature-component signal generated in step #600 to generate a baseband signal. Then, the procedure goes to a next step #800, "interpolation filtering" subroutine.

In step #800, the baseband signal generated in step #700 is converted by the interpolation filter 18 into symbol-rate frequency data. Then, the procedure goes to a next step #900, "roll-off filtering" subroutine.

In step #900, based on the symbol-rate frequency data obtained in step #800, a low-frequency-domain, symbol-rate frequency signal is generated by the roll-off filter 19. Then, the procedure goes to a next step #1000, "waveform equalization" subroutine.

In step #1000, distortion caused by the transmission path is eliminated by the waveform equalizer 1000 from the low-frequency-domain, symbol-rate frequency signal generated in step #900. Then, the procedure goes to a next step #1100, "error correction" subroutine.

In step #1100, the error corrector 1001 corrects an error caused by the transmission path and occurring in the low-frequency-domain, symbol-rate frequency signal with its waveform equalized in step #1000. Consequently, the demodulated transport stream is outputted to the MPEG decoder externally provided. Then, the procedure goes to a next step #1200, "C/N detection" subroutine.

In step #1200, based on the error correction process by the error corrector 1001 in step #1100, the amount of noise components on the transmission path is calculated for obtaining a C/N ratio.

The digital modulated signal waves Sb deteriorates due to various interference factors while being transmitted from the broadcasting stations through the air to the antenna 10. Such factors include reflection or interruption by airplanes, automobiles, or large fixtures such as buildings; interference by electric waves emitted from other sources; and electromagnetic interference by natural or human causes. For familiar example, the VSB modulated signal wave Sb received by the antenna 10 is extremely varied in receive level if a person simply moves around the antenna 10. Such receive level variation leads to deterioration in quality of the VSB modulated signal wave Sb, greatly influencing demodulation capabilities of the VSB demodulation apparatus.

One influence due to interference is toward a bit error rate in error correction process carried out by the error corrector 1001. This bit error rate can be controlled with the averaging coefficient of the averaging filter in the AGC circuit (the first averaging coefficient K of the averaging filter 22 in the AGC 15). A larger averaging coefficient can be adapted to larger variation in receive level of the wave at the antenna, but causes an increase in thermal noise of the entire apparatus and deterioration in bit error rate. Conversely, a smaller averaging coefficient does not enable the AGC circuit to follow larger variation in receive level, but causes a decrease in thermal noise of the entire apparatus and improvement in bit error rate.

In the conventional digital demodulation apparatus, the averaging coefficient of the averaging filter in the AGC circuit is uniquely specified. Therefore, the conventional apparatus cannot simultaneously satisfy the needs for supporting variation in receive level of the wave coming to the antenna and for improving the bit error rate of the entire apparatus.

SUMMARY OF THE INVENTION

In view of the above, an object of the present invention is to provide a digital demodulation apparatus capable of adaptively and dynamically setting the averaging coefficient of the averaging filter, according to variation in receive level of a wave and a bit error rate of the entire apparatus.

The present invention has the following features to achieve the object above.

A first aspect of the present invention is directed to digital demodulation apparatus that amplifies, for demodulation, a digital modulated signal wave received through the air with gain automatically controlled for generating a digital signal having a predetermined amplitude, the apparatus comprising:

a receive level variation detector for detecting receive level variation of the received digital signal wave; and a gain adjuster for adjusting the gain based on the detected receive level variation.

As described above, in the first aspect, automatic gain control and amplification processing is controlled according to a state of receiving the digital modulated signal wave varied by various interruption factors while coming through the air, thereby enabling digital signal demodulation with high quality.

According to a second aspect, in the first aspect, the received level variation detector detects the receive level variation based on an amplitude of the received digital signal wave.

According to a third aspect, in the first aspect, the receive level variation detector detects the receive level variation based on an error rate of the received digital signal wave.

According to a fourth aspect, in the first aspect, the received level variation detector comprises a tuner for extracting a desired digital modulated signal from the received digital modulation waves, and generating a first digital modulated signal;

an automatic gain control amplifier for amplifying the first digital modulated signal with the gain, and generating a second digital modulated signal;

a digitizer for converting the second digital modulated signal into a third digital modulated signal; and a tuned signal receive level variation detector for detecting receive level variation of the first digital modulated signal based on an amplitude of the third digital modulated signal, and the gain adjuster adjusts the gain based on the detected receive level variation of the third digital modulated signal.

According to a fifth aspect, in the fourth aspect, the tuned signal receive level variation detector further comprises an amplitude detector for detecting an amplitude value of the third digital modulated signal;

an averaging filter for carrying out average-filtering on the detected amplitude value with a predetermined averaging coefficient to detect an average amplitude value;

an error detector for detecting an error between the detected average amplitude value and a desired average value; and a loop filter for carrying out loop filtering on the detected error with a predetermined integral coefficient, and generating a stabilization signal for stabilizing an automatic gain control amplification process, and the tuned signal receive level variation detector detects the receive level variation based on the generated stabilization signal.

According to a sixth aspect, in the fifth aspect, the tuned signal receive level variation detector further comprises difference detector for detecting a difference between two arbitrary values of the stabilization signal, and the receive level variation is detected based on a comparison result obtained by comparing the difference with a predetermined threshold.

As described above, in the sixth aspect, the number of thresholds and the value thereof are arbitrarily set. Thus, gain control is appropriately carried out according to the type of received digital modulation wave and the receiving state, thereby enabling digital signal demodulation with high quality.

According to a seventh aspect, in the sixth aspect, the tuned signal receive level variation detector generates a level variation signal indicating the comparison result, and the gain controller controls the gain based on the level variation signal.

According to an eighth aspect, in the seventh aspect, the averaging filter is an adaptive averaging filter for varying the averaging coefficient based on a value of the level variation signal to enable digital signal demodulation with high quality by appropriately setting the averaging coefficient based on the detected receive level variation.

As described above, in the eighth aspect, the averaging coefficient is set based on receive level variation. Thus, adaptive average-filtering according to receive level variation can be carried out.

According to a ninth aspect, in the eighth aspect, the averaging filter includes a first averaging coefficient and a second averaging coefficient larger than the first averaging coefficient, selects the first averaging coefficient if the detected level variation in the level variation signal is smaller than the threshold, and selects the second averaging coefficient if the detected level variation in the level variation signal is not smaller than the threshold.

According to a tenth aspect, in the seventh aspect, the loop filter is an adaptive loop filter for varying the integral coefficient based on the level variation signal to enable digital signal demodulation with high quality by appropriately setting the integral coefficient based on the detected receive level variation.

As described above, in the tenth aspect, the integral coefficient is set based on receive level variation. Thus, adaptive loop filtering according to receive level variation can be carried out.

According to an eleventh aspect, in the tenth aspect, the loop filter includes a first integral coefficient and a second integral coefficient larger than the first integral coefficient, selects the first integral coefficient if the detected level variation in the level variation signal is smaller than the threshold, and selects the second integral coefficient if the detected level variation in the level variation signal is not smaller than the threshold.

According to a twelfth aspect, in the sixth aspect, the tuned signal receive level variation detector further comprises a PWM calculator for converting the stabilization signal into a square-wave signal represented by 0 and 1; and a low-pass filter for extracting low-frequency components from the square-wave signal to generate a low-frequency, square-wave signal, and the tuned signal receive level variation detector detects the receive level variation based on the low-frequency, square-wave signal.

According to a thirteenth aspect, in the twelfth aspect, the gain adjuster adjusts the gain based on the low-frequency square-wave signal.

According to a fourteenth aspect, in the twelfth aspect, the tuned signal receive level variation detect or further comprises a gain control signal generator for generating, based on the low-frequency, square-wave signal, a gain adjusting signal for controlling gain of the automatic gain control amplifier, and based on the gain control signal, the tuned signal receive level variation detector detects the receive level variation.

According to a fifteenth aspect, in the fourteenth aspect, the gain controller controls the gain based on the gain control signal.

According to a sixteenth aspect, in the fourth aspect, the tuned signal receive level variation detector further comprises a Hilbert filter for extracting quadrature components from the third digital demodulation signal;

a detector for detecting and correcting an error between a frequency of the third digital modulated signal and an oscillation frequency of the tuner, and frequency-converting the error-corrected third digital modulated signal into a baseband signal;

an interpolation filter for converting the baseband signal into symbol-rate frequency data based on system-clock frequency data;

a roll-off filter for extracting low-frequency components from the symbol-rate frequency data at a desired roll-off rate, and generating low-frequency, symbol-rate frequency data;

a waveform equalizer for eliminating distortion caused by a transmission path from the low-frequency, symbol-rate frequency data;

an error corrector for correcting an error caused by the transmission path from the wave form-equalized, low-frequency, symbol-rate frequency data; and an error rate detector for detecting an error rate of the third digital demodulation signal, and based on the detected error rate, the receive level variation detector detects the receive level variation.

According to a seventeenth aspect, in the sixteenth aspect, the tuned signal receive level variation detector further comprises an amplitude detector for detecting an amplitude value of the third digital modulated signal;

an averaging filter for carrying out average-filtering on the detected amplitude value with a predetermined averaging coefficient to detect an average amplitude value;

an error detector for detecting an error between the detected average amplitude value and a desired average value; and a loop filter for carrying out loop filtering on the detected error with a predetermined integral coefficient, and generating a stabilization signal for stabilizing an automatic gain control amplification process, and the tuned signal receive level variation detector detects the receive level variation based on a comparison result obtained by comparing the detected error rate with a predetermined threshold.

According to an eighteenth aspect, in the seventeenth aspect, the tuned signal receive level variation detector generates a level variation signal indicating the comparison result, and the gain adjuster adjusts the gain based on the level variation signal.

According to a nineteenth aspect, in the eighteenth aspect, the averaging filter is an adaptive averaging filter for varying the averaging coefficient based on the level variation signal to enable digital signal demodulation with high quality by appropriately setting the averaging coefficient based on the receive level variation.

According to a twentieth aspect, in the nineteenth aspect, the averaging filter includes a first averaging coefficient and a second averaging coefficient larger than the first averaging coefficient, selects the first averaging coefficient if the detected level variation in the level variation signal is smaller than the threshold, and selects the second averaging coefficient if the detected level variation in the level variation signal is not smaller than the threshold.

According to a twenty-first aspect, in the eighteenth aspect, the loop filter is an adaptive loop filter for varying the integral coefficient based on the level variation signal to enable the apparatus to demodulate, with high quality, the digital signal with the integral coefficient appropriately set based on the detected receive level variation.

According to a twenty-second aspect, in the twenty-first aspect, the loop filter includes a first integral coefficient and a second integral coefficient larger than the first integral coefficient, selects the first integral coefficient if the detected level variation in the level variation signal is smaller than the threshold, and selects the second integral coefficient if the detected level variation in the level variation signal is not smaller than the threshold.

According to a twenty-third aspect, in the seventeenth aspect, the tuned signal receive level variation detector further comprises a PWM calculator for converting the stabilization signal into a square-wave signal represented by 0 and 1;

a low-pass-filter for extracting low-frequency components from the square-wave signal to generate a low-frequency square-wave signal; and a gain adjusting signal generator for generating, based on the low-frequency, square-wave signal, a gain adjusting signal for adjusting gain of the automatic gain control amplifier, and the gain adjuster adjusts the gain based on the gain adjusting signal.

According to a twenty-fourth aspect, in the second aspect, the receive level variation detector comprises a tuner for extracting a digital modulated signal of a desired frequency from the received digital modulated signal wave, and generating a first digital modulated signal;

an automatic gain control amplifier for amplifying the first digital modulated signal with the gain, and generating a second digital modulated signal;

a digitizer for converting the second digital modulated signal into a third digital modulated signal; and a tuned signal receive level variation detector for detecting the receive level variation based on an amplitude of the received digital modulation wave, and the gain adjuster adjusts the gain based on the detected receive level variation.

According to a twenty-fifth aspect, in the twenty-fourth aspect, the tuned signal receive level variation detector further comprises an amplitude detector for detecting an amplitude value of the third digital modulated signal; and an averaging filter for carrying out average-filtering on the detected amplitude value with a predetermined averaging coefficient to detect an average amplitude value;

an error detector for detecting an error between the detected average amplitude value and a desired average value; and a loop filter for carrying out loop filtering on the detected error with a predetermined integral coefficient, and generating a stabilization signal for stabilizing an automatic gain control amplification process, and the tuned signal receive level variation detector detects the receive level variation based on the detected stabilization signal.

According to a twenty-sixth aspect, in the twenty-fifth aspect, the tuned signal receive level variation detector further comprises a difference detector for detecting a difference between arbitrary two values of the stabilization signal, and the receive level variation is detected based on a comparison result obtained by comparing the difference with a predetermined threshold.

According to a twenty-seventh aspect, in the twenty-sixth aspect, the tuned signal receive level variation detector generates a level variation signal indicating the comparison result, and the gain adjuster adjusts the gain based on the level variation signal.

According to a twenty-eighth aspect, in the twenty-seventh aspect, the averaging filter is an adaptive averaging filter for varying the averaging coefficient based on a value of the level variation signal to enable digital signal demodulation with high quality by appropriately setting the averaging coefficient based on the detected receive level variation.

According to a twenty-ninth aspect, in the twenty-eighth aspect, the averaging filter includes a first averaging coefficient and a second averaging coefficient larger than the first averaging coefficient, selects the first averaging coefficient if the detected level variation in the level variation signal is smaller than the threshold, and selects the second averaging coefficient if the detected level variation in the level variation signal is not smaller than the threshold.

According to a thirtieth aspect, in the twenty-seventh aspect, the loop filter is an adaptive averaging filter for varying the integral coefficient based on the level variation signal to enable digital signal demodulation with high quality by appropriately setting the integral coefficient based on the detected receive level variation.

According to a thirty-first aspect, in the thirtieth aspect, the loop filter includes a first integral coefficient and a second integral coefficient larger than the first integral coefficient, selects the first integral coefficient if the detected level variation in the level variation signal is smaller than the threshold, and selects the second integral coefficient if the detected level variation in the level variation signal is not smaller than the threshold.

According to a thirty-second aspect, in the twenty-sixth aspect, the tuned signal receive level variation detector further comprises a PWM calculator for converting the stabilization signal into a square-wave signal represented by 0 and 1;

a low-pass filter for extracting low-frequency components from the square-wave signal to generate a low-frequency square-wave signal; and a gain adjusting signal generator for generating, based on the low-frequency, square-wave signal, a gain adjusting signal for adjusting gain of the automatic gain control amplifier, and the gain adjuster adjusts the gain based on the gain adjusting signal.

A thirty-third aspect of the present invention is directed to an automatic gain controller that controls gain of a digital demodulation apparatus that extracts a digital modulated signal of a desired frequency from digital modulated signal waves received through the air and generates a first digital modulated signal; carries out, for amplification, automatic-gain-controlling on the first digital modulated signal with predetermined gain and generates a second digital modulated signal having a desired amplitude value; and converts the second digital modulated signal into a third digital modulated signal, the automatic gain controller comprising:

an amplitude detector for detecting the amplitude value of the third digital modulated signal;

an averaging filter for carrying out average-filtering on the detected amplitude value with a predetermined averaging coefficient, and detecting an average amplitude value;

an error detector for detecting an error between the detected average amplitude value and a desired average value;

a loop filter for carrying out loop filtering on the detected error with a predetermined integral coefficient, and generating a stabilization signal for stabilizing an automatic gain control amplification process;

a receive level variation detector for detecting the receive level variation based on the detected stabilization signal; and an average coefficient adjuster for varying the average coefficient of the average-filtering based on the detected receive level variation.

A thirty-fourth aspect of the present invention is directed to an automatic gain controller that controls gain of a digital demodulation apparatus that extracts a digital modulated signal of a desired frequency from digital modulated signal waves received through the air and generates a first digital modulated signal; carries out, for amplification, automatic-gain-controlling on the first digital modulated signal with predetermined gain and generates a second digital modulated signal having a desired amplitude value; and converts the second digital modulated signal into a third digital modulated signal, the automatic gain controller comprising:

an amplitude detector for detecting an amplitude value of the third digital modulated signal;

an averaging filter for carrying out average-filtering on the detected amplitude value with a predetermined averaging coefficient, and detecting an average amplitude value;

an error detector for detecting an error between the detected average amplitude value and a desired average value;

a loop filter for carrying out loop filtering on the detected error with a predetermined integral coefficient, and generating a stabilization signal for stabilizing an automatic gain control amplification process;

a receive level variation detector for detecting the receive level variation based on the detected stabilization signal; and an integral coefficient adjuster for varying the integral coefficient of the loop filter based on the detected receive level variation.

A thirty-fifth aspect of the present invention is directed to an automatic gain controller that controls gain of a digital demodulation apparatus that extracts a digital modulated signal of a desired frequency from digital modulated signal waves received through the air and generates a first digital modulated signal; carries out, for amplification, automatic-gain-controlling on the first digital modulated signal with predetermined gain and generates a second digital modulated signal having a desired amplitude value; and converts the second digital modulated signal into a third digital modulated signal, the automatic gain controller comprising:

an amplitude detector for detecting an amplitude value of the third digital modulated signal;

an averaging filter for carrying out average-filtering on the detected amplitude value with a predetermined averaging coefficient, and detecting an average amplitude value;

an error detector for detecting an error between the detected average amplitude value and a desired average value;

a loop filter for carrying out loop filtering on the detected error with a predetermined integral coefficient, and generating a stabilization signal for stabilizing an automatic gain control amplification process;

a receive level variation detector for detecting the receive level variation based on an amplitude of the received digital modulated signal wave; and an averaging coefficient adjustor for varying the averaging coefficient of the averaging filter based on the detected receive level variation.

A thirty-sixth aspect of the present invention is directed to an automatic gain controller that controls gain of a digital demodulation apparatus that extracts a digital modulated signal of a desired frequency from digital modulated signal waves received through the air and generates a first digital modulated signal; carries out, for amplification, automatic-gain-controlling on the first digital modulated signal with predetermined gain and generates a second digital modulated signal having a desired amplitude value; and converts the second digital modulated signal into a third digital modulated signal, the automatic gain controller comprising:

an amplitude detector for detecting an amplitude value of the third digital modulated signal;

an averaging filter for carrying out average-filtering on the detected amplitude value with a predetermined averaging coefficient, and detecting an average amplitude value;

an error detector for detecting an error between the detected average amplitude value and a desired average value;

a loop filter for carrying out loop filtering on the detected error with a predetermined integral coefficient, and generating a stabilization signal for stabilizing an automatic gain control amplification process;

a receive level variation detector for detecting the receive level variation based on an amplitude of the received digital modulated signal wave; and an averaging coefficient adjustor for varying the integral coefficient of the loop filter based on the detected receive level variation.

These and other objects, features, aspects and advantages of the present invention will become more apparent from the following detailed description of the present invention when taken in conjunction with the accompanying drawings.

DESCRIPTION OF THE PREFERRED EMBODIMENTS

With reference to FIGS. 1, 2, 3, 4, 5, 6, and 7, a digital demodulation apparatus according to a first embodiment of the present invention is described. Furthermore, with reference to FIGS. 8, 9, 10, 11, 12, 13, and 14, a digital demodulation apparatus according to a second embodiment of the present invention is described. Still further, with reference to FIGS. 15, 16, 17, 18, and 19, a digital demodulation apparatus according to a third embodiment of the present invention is described. Still further, with reference to FIGS. 20, 21, 22, 23, and 24, a digital demodulation apparatus according to a fourth embodiment of the present invention is described.

First Embodiment

Figure 1:
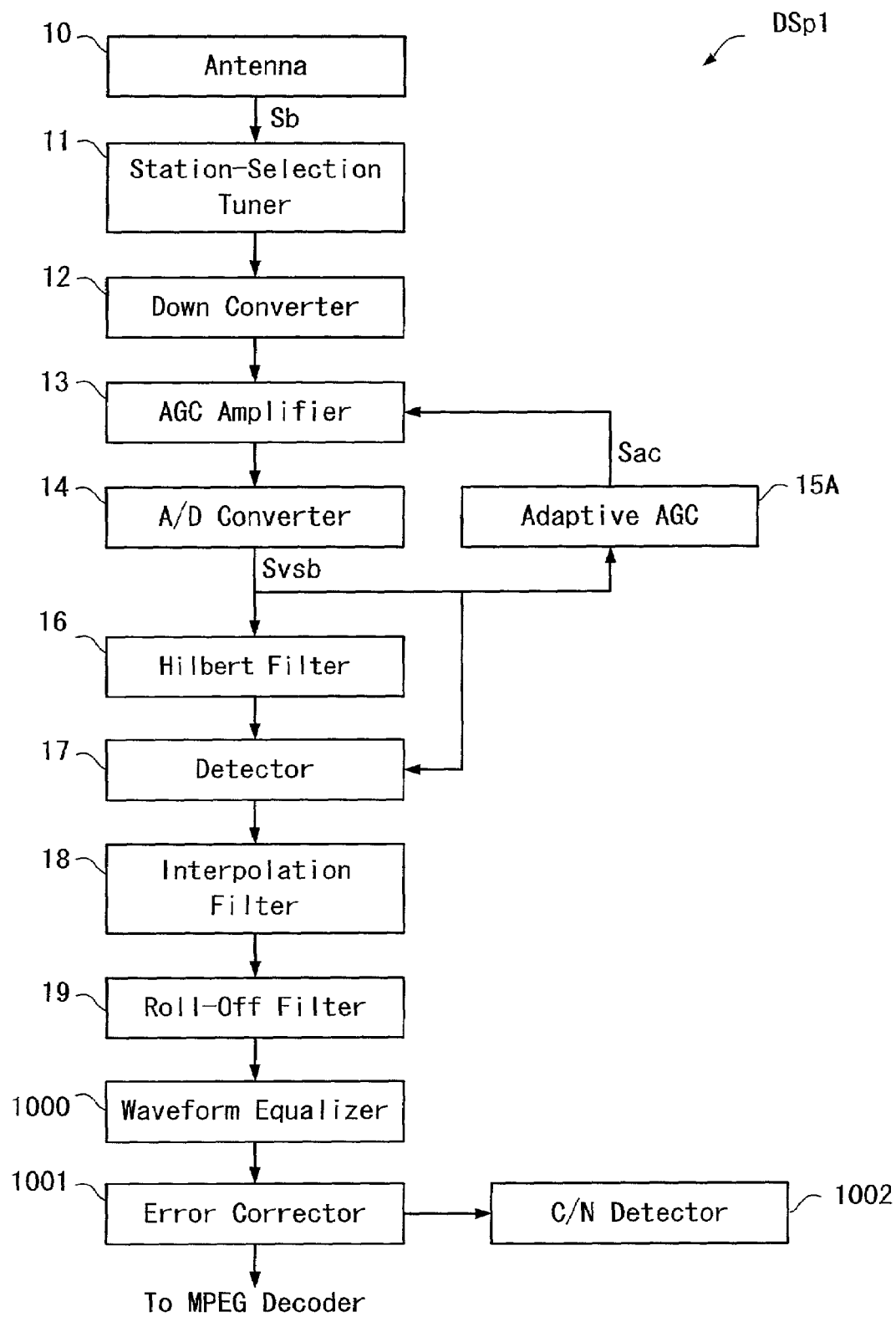
FIG. 1 is a block diagram showing a VSB demodulation apparatus according to a first embodiment of the present invention.

In FIG. 1, a digital apparatus is exemplarily structured as the VSB demodulation apparatus according to the first embodiment of the present invention. A VSB demodulation apparatus DSp1 includes an antenna 10, a station-selection tuner 11, a down-converter 12, an AGC amplifier 13, an A/D converter 14, an adaptive AGC 15A, a Hilbert filter 16, a detector 17, an interpolation filter 18, a roll-off filter 19, a waveform equalizer 1000, an error corrector 1001, and C/N detector 1002.

The antenna 10 receives VSB demodulation signal waves Sb coming from broadcasting stations over a plurality of channels. Of these received VSB modulated signal waves Sb, the station-selection tuner 11 selects the one to which it is tuned. The down-converter 12 is connected to the station-selection tuner 11 to convert the frequency of the VSB modulated signal received from the station-selection tuner 11 into a desired intermediate frequency (IF).

The AGC amplifier 13 is a gain control amplifier for adjusting the gain of an IF signal outputted from the down-converter 12 to a desired magnitude. The A/D converter 14 converts the frequency-converted, gain-adjusted analog VSB modulated signal outputted from the AGC amplifier 13 into a digital signal, with a frequency twice a symbol frequency.

The adaptive AGC 15A is a gain controller. The adaptive AGC 15A calculates an average value of amplitudes of the digital VSB modulated signal (hereinafter simply referred to as "VSB modulated signal" unless otherwise required) Svsb outputted from the A/D converter 14. The adaptive AGC 15A then evaluates variation in receive level of the VSB modulated signal Svsb, and generates a digital signal having a desired amplitude for normal operation of the VSB demodulation apparatus. This digital signal is supplied to the AGC amplifier 13 as a control signal for controlling the gain of the AGC amplifier 13 to a predetermined value. This control signal is adapted to the variation in receive level of the VSB modulated signal Svsb, and in this sense, hereinafter referred to as a receive level variation adaptive control signal Sac.

As will be described below in detail with reference to FIG. 2, in the present embodiment, the adaptive AGC 15A calculates a desired amplitude from the VSB modulated signal Svsb outputted from the A/D converter 14 for calculating the amount of level variation in amplitude of the digital modulated signal. The adaptive AGC 15A is provided with an adaptive averaging filter that selects a smaller averaging coefficient if the amount of variation is smaller and a larger averaging coefficient if larger. The adaptive AGC 15A supplies the receive level variation adaptive control signal Sac to the AGC amplifier 13.

Based on the receive level variation adaptive control signal Sac outputted from the adaptive AGC 15A, the AGC amplifier 13 adjusts the amplitude of the VSB modulated signal received from the down-converter 12, and then outputs the resultant signal to the A/D converter 14. As such, the AGC amplifier 13, the A/D converter 14, and the adaptive AGC 15A forms a feed-back loop circuit, and obtained therefrom is the VSB modulated signal Svsb having the desired amplitude. The process of obtaining such VSB modulated signal Svsb will be described below in detail with reference to FIGS. 2, 3, 4, and 5.

The Hilbert filter 16 extracts quadrature components from the VSB modulated signal Svsb outputted from the A/D converter 14, and produces a quadrature component signal for output to the detector 17. Based on the VSB modulated signal Svsb outputted from the A/D converter 14 and the quadrature component signal outputted from the Hilbert filter 16, the detector 17 demodulates and corrects a frequency error between the received VSB modulated signal Svsb and an oscillator of the station-selection tuner, and generates a baseband signal.

The interpolation filter 18 converts, based on clock frequency of the apparatus, the baseband signal outputted from the detector 17 into symbol-rate frequency data.

The roll-off filter 19 extracts, at a desired roll-off ratio, components of low frequency domain from the symbol-rate frequency data received from the interpolation filter 18. the waveform equalizer 1000 equalizes a waveform by eliminating distortion caused by the transmission path from the low-frequency-domain, symbol-rate frequency signal outputted from the roll-off filter 19. The error corrector 1001 corrects an error caused by the transmission path in the low-frequency-domain, symbol-rate frequency signal with its waveform equalized by the waveform equalizer 1000. Thus, a transport stream of the VSB modulated signal Svsb is demodulated. The demodulated transport stream is outputted to an MPEG decoder (not shown) in the following stage. The C/N detector 1002 is connected to the error corrector 1001 for calculating noise components on a transmission path from the error correction process performed by the error corrector 1001, for the C/N ratio, and generates a C/N signal Scn.

Figure 2:
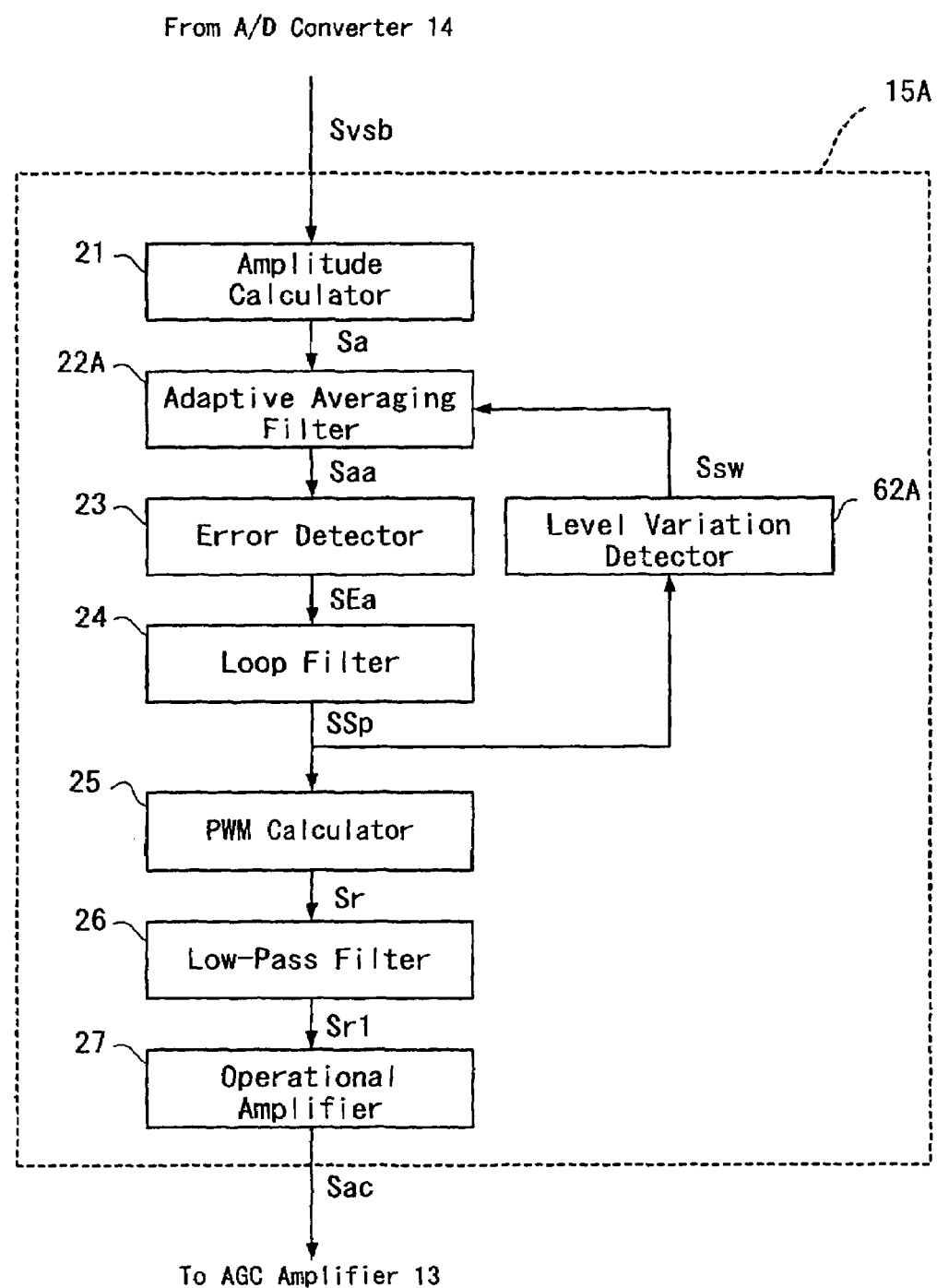
FIG. 2 is a block diagram showing the detailed structure of an adaptive AGC of FIG. 1.

With reference to FIG. 2, the adaptive AGC 15A is described. The adaptive AGC 15A includes an amplitude calculator 21, an adaptive averaging filter 22A, an error detector 23, a loop filter 24, a PWM calculator 25, a low-pass filter 26, an operational amplifier 27, and a level variation detector 62A. As described above, the adaptive AGC 15A calculates the average value of amplitudes using an output signal from the A/D converter 14, generates the receive level variation adaptive control signal Sac for inputting, to the A/D converter, a digital signal having the desired amplitude for normal operation of the apparatus, and outputs the receive level variation adaptive control signal Sac to the AGC amplifier 13.

For the above described operation, the amplitude calculator 21 calculates an absolute value of an output of the VSB modulated signal Svsb received from the A/D converter 14 to obtain the desired amplitude. The amplitude calculator 21 then outputs an amplitude signal Sa indicative of the obtained amplitude. The adaptive averaging filter 22A calculates, based on the amplitude signal Sa received from the amplitude calculator 21 and a level variation signal Ssw received from the level variation detector 62A, an average value of amplitudes of the VSB modulated signal Svsb according to the variation in receive level of the VSB modulated signal Svsb. The adaptive averaging filter 22A produces an adaptive averaging amplitude signal Saa.

Based on the adaptive averaging amplitude signal Saa received from the adaptive averaging filter 22A, the error detector 23 detects an error Ea between the actual average amplitude of the VSB modulated signal Svsb and the desired average amplitude for normal operation of the entire VSB demodulation apparatus, and produces an average amplitude error signal SEa.

Based on the average amplitude error signal received from the error detector 23, the loop filter 24 integrates the detected error Ea for generating a stabilization signal SSp, thereby stabilizing the entire loop in the adaptive AGC 15A.

Based on the stabilization signal SSp outputted from the loop filter 24, the level variation detector 62A detects the amount of variation in receive level of the VSB modulated signal Svsb, and generates the level variation signal indicative of the detected amount of receive level variation. In other words, larger level variation of the signal received by the antenna 10 leads to larger variation in the output from the loop filter 24, while smaller level variation leads to smaller variation in the output. Therefore, the level variation detector 62A calculates the value of the stabilization signal SSp outputted from the loop filter 24, and then generates the level variation signal Ssw.

The adaptive averaging filter 22A selectively uses internal averaging coefficients based on the level variation signal Ssw received from the level variation detector 62A for carrying out averaging according to the receive level variation of the VSB modulated signal Svsb. Then, the adaptive averaging filter 22A generates the above-stated adaptive averaging amplitude signal Saa. In this sense, the level variation signal Ssw can be said to be an averaging coefficient control signal. The process in the adaptive averaging filter 22A will be described in detail below with reference to FIG. 3.

The PWM calculator 25 converts the stabilization signal SSp outputted from the loop filter 24 into a square wave signal Sr indicative of error information by a ratio between 0s and 1s in a square wave. The low-pass filter 26 extracts low frequency components from the square wave signal Sr received from the PWM calculator 25 for stabilizing the square wave signal Sr at a desired level, and generates a low-frequency square wave signal Sr1. The operational amplifier 27 amplifies the low-frequency square wave signal Sr1 received from the low-pass filter 26 for adjusting loop gain in the entire adaptive AGC 15A. Then, the operational amplifier 27 inputs the amplified signal as a receive level variation adaptive control signal Sac to the AGC amplifier 13.

Figure 3:
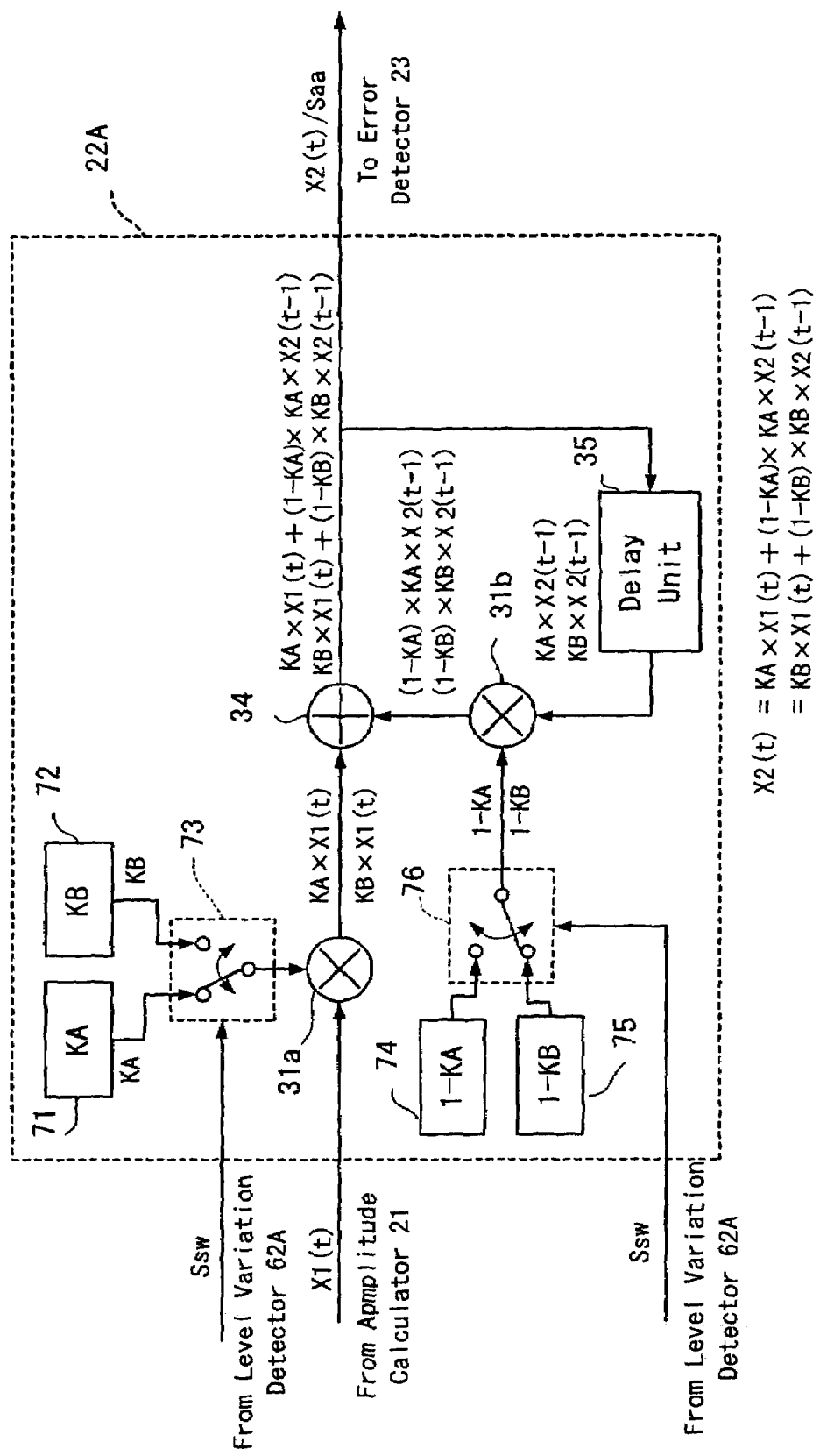
FIG. 3 is a block diagram showing the detailed structure of an adaptive averaging filter of FIG. 2.

With reference to FIG. 3, the adaptive averaging filter 22A is described. The adaptive averaging filter 22A includes multipliers 31a and 31b, a delay unit 35, a first small-level-variation averaging coefficient provider 71, a first large-level-variation averaging coefficient provider 72, a first switch 73, a second small-level-variation averaging coefficient provider 74, a second large-level-variation averaging coefficient provider 75, and a second switch 76.

The first small-level-variation averaging coefficient provider (hereinafter referred to as first SL coefficient provider) 71 holds a first small-level-variation averaging coefficient KA that is suitable when level variation is small, and outputs the coefficient KA upon request. The first large-level-variation averaging coefficient provider (hereinafter referred to as first LL coefficient provider) 72 holds a first large-level-variation averaging coefficient KB that is suitable when level variation is large, and outputs the coefficient KB upon request.

The first switch 73 is connected to an output port of the first SL coefficient provider 71, an output port of the first LL coefficient provider 72, an input port of the multiplier 31a, and an output port of the level variation detector 62A. Based on the level variation signal Ssw received from the level variation detector 62A, the first switch 73 selects either one output port of the first SL coefficient provider 71 or the first LL coefficient provider 72 for connecting the selected output port to an input port of the multiplier 31a. As a result, depending upon the level variation signal Ssw, the coefficient KA or KB is supplied to the multiplier 31b.

The second SL coefficient provider 74 holds a value obtained by subtracting the first small-level-variation averaging coefficient from 1, that is, "1−KA", as a second small-level-variation averaging coefficient for output upon request. The second LL coefficient provider 75 holds a value obtained by subtracting the first large-level-variation averaging coefficient from 1, that is, "1−KB", as a second large-level-variation averaging coefficient for output upon request.

The second switch 76 is connected to an output port of the second SL coefficient provider 74, an output port of the second LL coefficient provider 75, an input port of the multiplier 31b, and the output port of the level variation detector 62A. Based on the level variation signal Ssw received from the level variation detector 62A, the second switch 76 selects either on output port of the second SL coefficient provider 74 and the second LL coefficient provider 75 for connecting the selected output port to the input port of the multiplier 31b. As a result, depending upon the level variation signal Ssw, either the coefficient 1−KA or 1−KB is supplied to the multiplier 31a.

In the present embodiment, the receive level variation is identified as either of two, "large (KB, 1−KB)" or "small (KA, 1−KA)". Therefore, the level variation signal Ssw is preferably so generated, by the level variation detector 62A, as to have a binary value representing "large" or "small". As will be described below, the level variation signal Ssw has an initial value corresponding to large level variation. The number of identification levels for receive level variation may be arbitrarily increased according to processing accuracy required. For convenience of description, the second small-level-variation averaging coefficient 1–KA and the second high-level-variation averaging coefficient 1–KB are hereinafter simply referred to as "1–KA" and "1–KB", respectively.

The processing in the adaptive averaging filter 22A is described below, where the amplitude signal Sa received from the amplitude calculator 21 is represented as X1(t), and the adaptive averaging amplitude signal Saa is as X2(t).

First, consider the case where the value of the level variation signal Ssw is smaller than a level variation threshold Lth, that is, the receive level variation of the VSB modulated signal Svsb is relatively small. In this case, the first switch 73 selects the first SL coefficient provider 71, while the second switch 76 selects the second SL coefficient provider 74. As a result, the multiplier 31a is supplied with the first small-level-variation averaging coefficient KA, while the multiplier 31b is with the second small-level-variation averaging coefficient 1–KA.

Consequently, the multiplier 31b multiplies KA×X2(t−1) received from the delay unit 35 by 1–KA received from the second SL coefficient provider 74 to produce (1–KA)×KA× X2(t−1). (1–KA)×KA×X2(t−1) is outputted to the adder 34. The adder 34 adds the KA×X1(t) received from the multiplier 31a and (1–KA)×KA×X2(t−1) received from the multiplier 31b together to produce KA×X1(t)+(1–KA)×KA×X2 (t−1). KA×X1(t)+(1–KA)×KA×X2(t−1) is supplied to the delay unit 35, and to the error detector 23 as the adaptive averaging amplitude signal Saa (X2(t)).

Next, consider the case where the value of the level variation signal Ssw is larger than the level variation threshold Lth, that is, the receive level variation of the VSB modulated signal Svsb is relatively large. In this case, the first switch 73 selects the first LL coefficient provider 72, while the second switch 76 selects the second LL coefficient provider 75. As a result, the multiplier 31a is supplied with the first large-level-variation averaging coefficient KB, while the multiplier 31b is with the second large-level-variation averaging coefficient 1–KB.

Here, one example of setting of the threshold Lth is described. If an amplitude difference D in level variation of the VSB modulated signal Svsb is 6 dB, the threshold Lth is set to 10 Hz. This is not restrictive, and the threshold Lth may take any suitable value according to the difference D.

The multiplier 31b multiplies KB×X2(t−1) received from the delay unit 35 by 1–KB received from the second LL coefficient provider 75 to produce (1–KB)×KB×X2(t−1). (1–KB)×KB×X2(t−1) is outputted to the adder 34. The adder 34 adds the KB×X1(t) received from the multiplier 31a and (1–KB)×KB×X2(t−1) received from the multiplier 31b together to produce KB×X1(t)+(1–KB)×KB×X2(t−1). KB×X1(t)+(1–KB)×KB×X2(t−1) is supplied to the delay unit 35, and to the error detector 23 as the adaptive averaging amplitude signal Saa (X2(t)).

Therefore, the following signal relation holds as represented by the following equation (3).

$$X2(t) = KA \times X1(t) + (1 - KA) \times X2(t-1) \quad (3)$$
$$= KB \times X1(t) + (1 - KB) \times X2(t-1)\}$$

Note that the above equation (3) represents the relation in successive two control cycles t and t−1. It is to be noted that the small-level-variation averaging coefficient KA and the large-level-variation averaging coefficient KB are respectively set to $\frac{1}{1000}$ and $\frac{1}{200}$. When the receive level variation of the VSB modulated signal Svsb is judged as small, the signal X1 multiplied by KA ($\frac{1}{1000}$) and the integration sum thereof multiplied by $\frac{999}{1000}$ produce the signal X2. When the receive level variation of the VSB modulated signal Svsb is judged as large, the signal X1 multiplied by KB ($\frac{1}{200}$) and the integration sum thereof multiplied by $\frac{199}{200}$ produce the signal X2.

Figure 4:
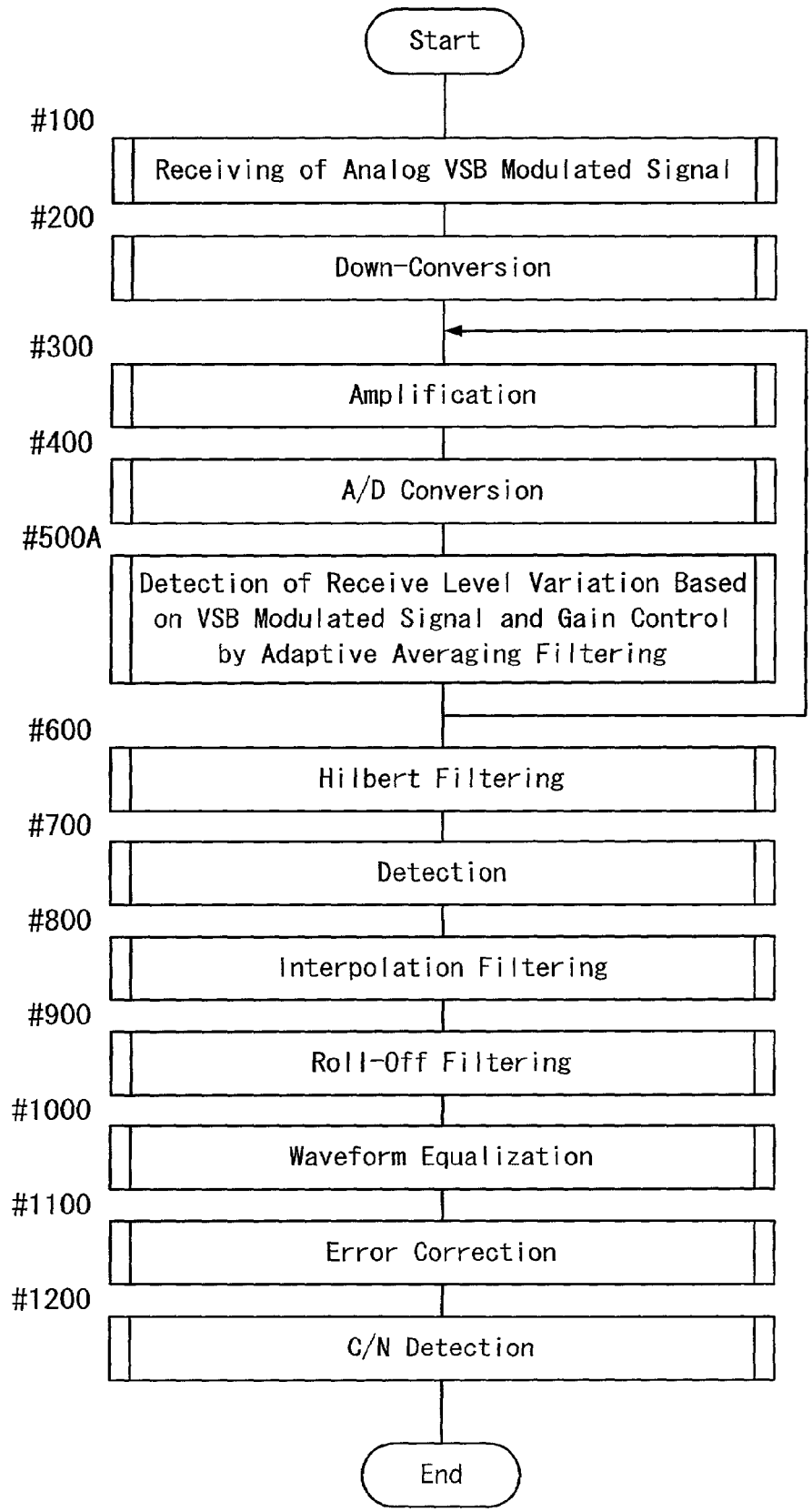
FIG. 4 is a flowchart showing the main operation of the VSB demodulation apparatus of FIG. 1.

Next, with reference to FIG. 4, the main operation of the VSB demodulation apparatus DSp1 is described. First, when the VSB demodulation apparatus DSp1 is powered on to start operation, the procedure starts step #100, "receiving of analog VSB modulated signal Svsb".

In step #100, from the VSB modulated signals over a plurality of channels received through the antenna, the station-selection tuner 11 selects a channel of a receive signal to be tuned. The analog VSB modulated signal of the selected channel is received. Then, the procedure goes to a next step #200, "down-conversion" subroutine.

In step #200, the analog VSB modulated signal received in step #100 is converted by the down-converter 12 into an IF signal having a desired frequency. Then, the procedure goes to a next step #300, "amplification" subroutine.

In step #300, the IF signal generated in step #200 is amplified with predetermined gain by the AGC amplifier 13. Then, the procedure goes to a next step #400, "A/D conversion" subroutine.

In step #400, the analog VSB modulated signal, which is the IF signal amplified in step #300, is converted by the A/D converter 14 into a digital VSB modulated signal. Then, the procedure goes to a next step #500A, "detection of receive level variation and adaptive average filtering" subroutine.

In step #500A, the adaptive AGC 15A generates a control signal Sac adaptive to the receive level variation of the VSB modulated signal generated in step #400. This control signal Sac controls the gain of the AGC amplifier 13. Specifically, when the VSB demodulation apparatus DSp1 carries out step #300 for the first time after starting to operate, the AGC amplifier 13 uses predetermined gain. Thereafter, the AGC amplifier 13 uses gain controlled by the adaptive AGC 15A. Then, the procedure goes to a next step #600, "Hilbert filtering" subroutine.

In step #600, based on the VSB modulated signal Svsb generated in step #400, the Hilbert filter 16 generates a quadrature-component signal. Then, the procedure goes to a next step #700, "detection" subroutine.

In step #700, the detector 17 detects the VSB modulated signal Svsb generated in step #400 with the quadrature-component signal generated in step #600 to generate a baseband signal. Then, the procedure goes to a next step #800, "interpolation filtering" subroutine.

In step #800, the baseband signal generated in step #700 is converted by the interpolation filter 18 into symbol-rate frequency data. Then, the procedure goes to a next step #900, "roll-off filtering" subroutine.

In step #900, based on the symbol-rate frequency data obtained in step #800, a low-frequency domain symbol-rate frequency signal is generated by the roll-off filter 19. Then, the procedure goes to a next step #1000, "waveform equalization" subroutine.

In step #1000, distortion caused by the transmission path is eliminated by the waveform equalizer 1000 from the low-frequency domain symbol-rate frequency signal generated in step #900. Then, the procedure goes to a next step #1100, "error correction" subroutine.

In step #1100, the error corrector 1001 corrects the error caused by the transmission path and occurring in the low-frequency domain symbol-rate frequency signal with its waveform equalized in step #1000. Consequently, the demodulated transport stream is outputted to the MPEG decoder externally provided. Then, the procedure goes to a next step #1200, "C/N ratio detection" subroutine.

In step #1200, based on the error correction process by the error corrector 1001 in step #1100, the amount of noise components on the transmission path is calculated for finding a C/N ratio.

As described above, in the VSB demodulation apparatus DSp1, the adaptive averaging filter 22A of the adaptive AGC 15A is appropriately set in step #500. This is done based on the receive level variation of the VSB modulated signal Svsb generated in step #400. Consequently, the gain of the AGC amplifier 13 in the above step #300 is controlled. Thus, the VSB modulated signal Svsb is amplified with appropriate gain corresponding to the receive level variation, thereby enabling digital signal demodulation with high-quality.

Figure 5:
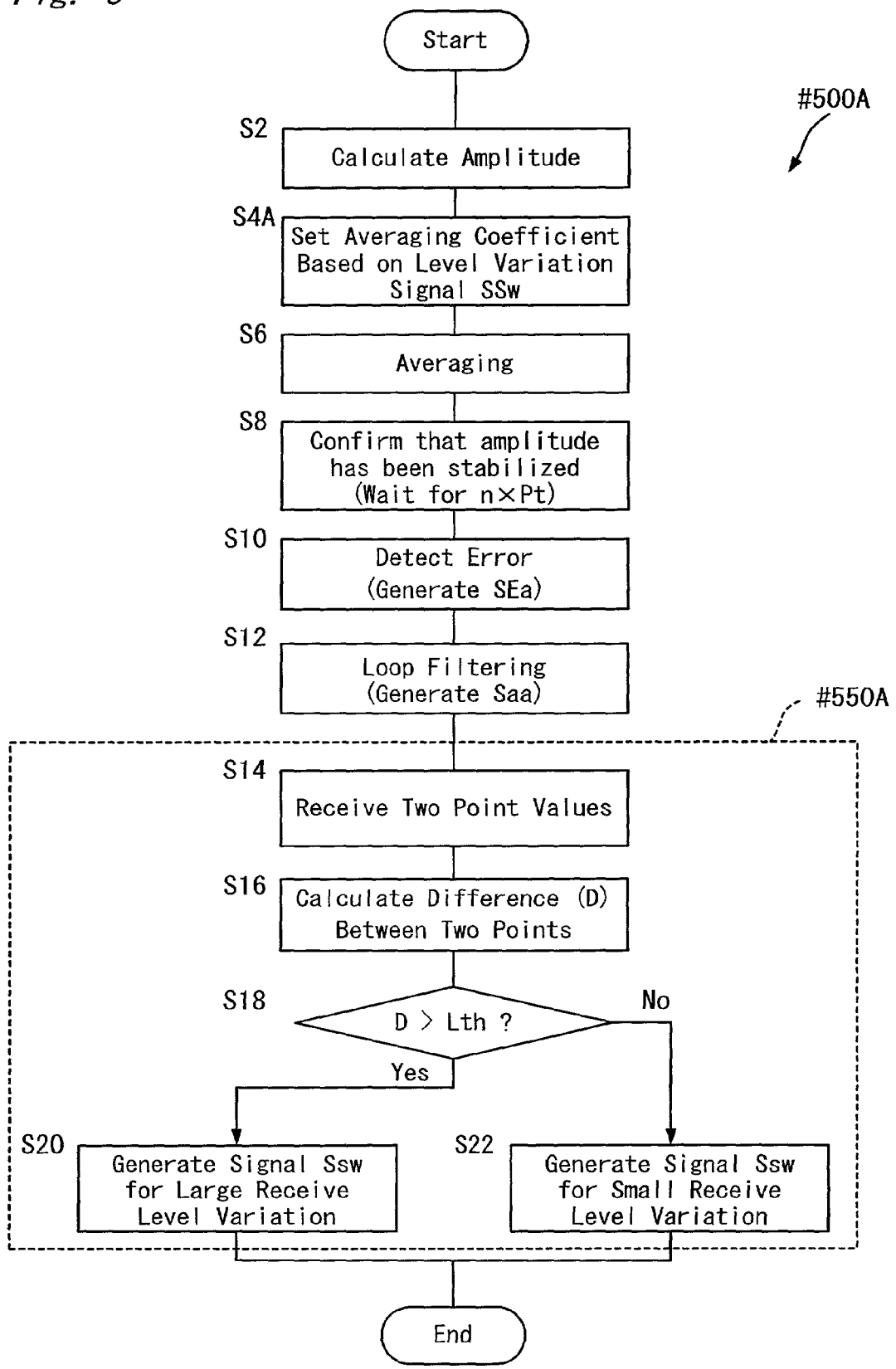
FIG. 5 is a flowchart showing the detailed operation in step #500A shown in FIG. 4.

Next, with reference to a flowchart shown in FIG. 5, described in detail is the above step #500A, "detection of the receive level variation based on the VSB modulated signal and gain control by adaptive average filtering", mainly carried out by the adaptive AGC 15A. This step #500A starts when the VSB modulated signal Svsb generated in step #400 is supplied from the A/D converter 14 to the amplitude calculator 21 of the adaptive AGC 15A.

First, in step S2, the amplitude calculator 21 calculates the amplitude of the received VSB modulated signal Svsb, and generates an amplitude signal Sa for output to the adaptive averaging filter 22A. Then, the procedure goes to a next step S4A.

In step S4A, the adaptive averaging filter 22A sets, as initial values, the first large-receive-level-variation averaging coefficient (hereinafter referred to as first LL coefficient) KB and the second large-receive-level-variation averaging coefficient (hereinafter referred to as second LL coefficient) 1−KB. This setting is based on the level variation signal Ssw supplied by the level variation detector 62A. This is because, as stated above, the level variation detector 62A is so set as to output the level variation signal Ssw indicative of large level variation when the VSB demodulation apparatus DSp1 has not yet detected the receive variation level of the VSB modulated signal Svsb, that is, when the apparatus DSp1 is started for the first time.

More specifically, the first switch 73 selects the first LL coefficient provider 72 for supplying the first LL coefficient KB to the multiplier 31a. The second switch 76 selects the second LL coefficient provider 75 for supplying the second LL coefficient 1−KB to the multiplier 31b. Then, the procedure goes to a next step S6.

In step S6, averaging processing is carried out based on the first LL coefficient KB and second LL coefficient 1−KB. In the processing, KB×X1(t)+(1−KB)×KB×X1(t−1) is calculated, and outputted to the error detector 23 as the adaptive averaging amplitude signal Saa. Then, the procedure goes to a next step S8.

In step S8, the procedure counts a predetermined period of time, and then goes to a next step S10. The adaptive averaging amplitude signal Saa is not stabilized until n control cycles t are through, and therefore, in step S8, the procedure waits for a period of n×Pt.

In step S10, the error detector 23 finds the error Ea based on the adaptive averaging amplitude signal Saa (KB×X1(t)+ (1−KB)×KB×X1(t−1)) found in step S6. Then, the error detector 23 generates an average amplitude error signal SEa for output to the loop filter 24.

In step 512, the loop filter 24 integrates the average amplitude error signal SEa generated in step S10. Then, the loop filter 24 generates an adaptive average amplitude signal Ssa for output to the level variation detector 62A.

In step S14, the level variation detector 62A obtains two arbitrary points in the adaptive average amplitude signal Ssa generated in step S12.

In step S16, the level variation detector 62A finds a difference D between the values of the two points obtained in step S14.

In step S18, the level variation detector 62A determines whether the difference D found in step S16 is larger than a predetermined level variation threshold Lth or not. If Yes, the procedure goes to step S20.

In step S20, the level variation detector 62A generates a level variation signal Ssw indicative of large level variation for output to the adaptive averaging filter 22A. Then, this subroutine ends.

On the other hand, if No in step S18, the procedure goes to step S22. In step S22, the level variation detector 62A generates a level variation signal Ssw indicative of small level variation for output to the adaptive averaging filter 22A. Then, this subroutine ends.

As described in steps S20 and S22, the level variation detector 62A generates and outputs the level variation signal Ssw indicative of large or small level variation. Consequently, when the process of step S4A is again carried out in the next control cycle t, the large-level-variation averaging coefficient (KB, 1−KB) or the small-level-variation averaging coefficient (KA, 1−KA) is set in the adaptive averaging filter 22A based on the level variation signal Ssw generated in step S20 or S22 in the previous control cycle t−1.

Note that the above steps S14, S16, S18, S20, and S22 correspond to the process of detecting receive level variation of the VSB modulated signal Svsb (step #550A), which is the main characteristic of the present invention. In step S20 or S22, the level variation signal Ssw having either one of the two values is generated. This is because, in the present embodiment, two different averaging coefficients are provided for the adaptive averaging filter 22A, indicating large and small level variation, respectively. Therefore, according to desired demodulation quality in the VSB demodulation apparatus DSp1, the number of different averaging coefficients may be three or more, and the level variation signal Ssw is varied accordingly.

Figure 6:
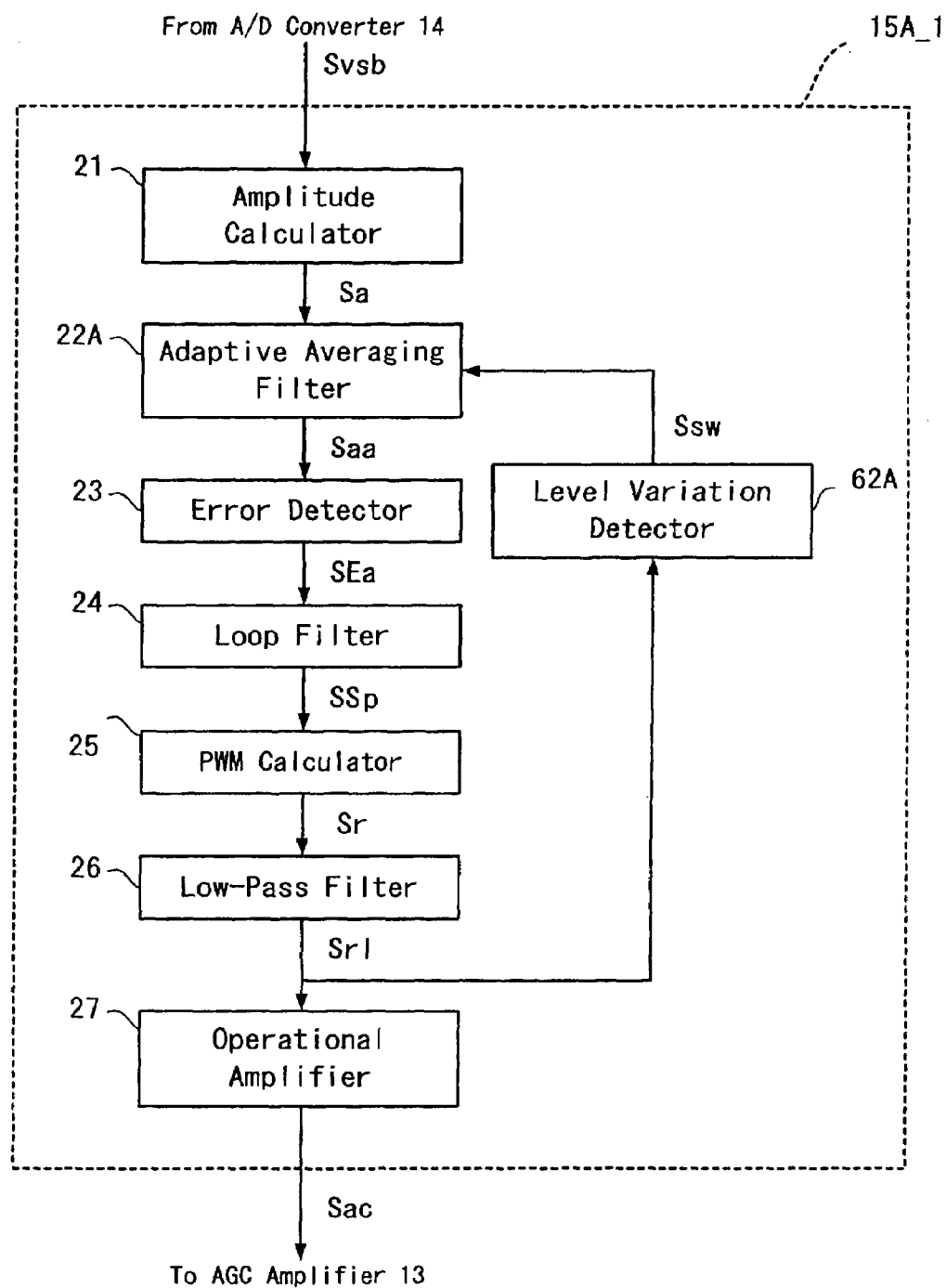
FIG. 6 is a block diagram showing a first modification of an adaptive AGC 15 of FIG. 2.

With reference to FIG. 6, a first modification of the adaptive AGC 15A according to the present embodiment is described. An adaptive AGC 15A_1 according to the first modification includes, like the adaptive AGC 15A shown in FIG. 2, the amplitude calculator 21, the adaptive averaging filter 22A, the error detector 23, the loop filter 24, the PWM calculator 25, the low-pass filter 26, the operational amplifier 27, and the level variation detector 62A. As stated above, in the adaptive AGC 15A, based on the output of the loop filter 24, the level variation detector 62A detects and evaluates receive level variation of the VSB modulated signal Svsb based on the output from the loop filter 24 for setting the averaging coefficient of the adaptive averaging filter 22A.

However, in the adaptive AGC 15A_1, the level variation detector 62A detects and evaluates receive level variation of the VSB modulated signal Svsb based on the low-frequency square-wave signal Sr1 outputted from the low-pass filter 26. Other than that, the adaptive AGC 15A_1 is basically the same in structure and operation as the adaptive AGC 15A. Also, the VSB demodulation apparatus DSp1 incorporating the adaptive AGC 15A_1 therein is basically the same in operation as the VSB demodulation apparatus DSp1 incorporating the adaptive AGC 15A therein.

Figure 7:
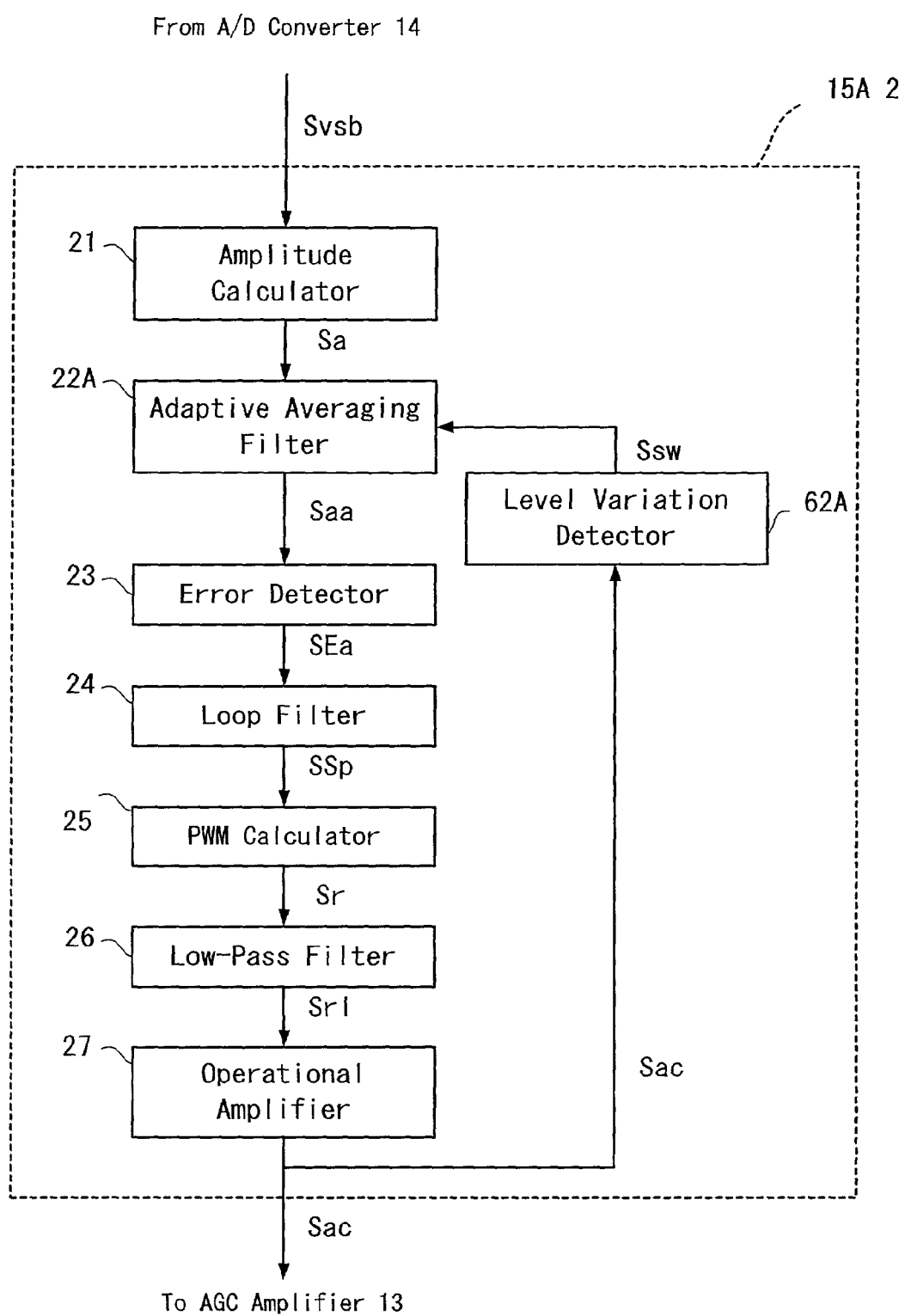
FIG. 7 is a block diagram showing a second modification of the adaptive AGC 15 of FIG. 2.

With reference to FIG. 7, a second modification of the adaptive AGC 15A according to the present embodiment is described. An adaptive AGC 15A_2 according to the second modification includes, like the adaptive AGC 15A shown in FIG. 2, the amplitude calculator 21, the adaptive averaging filter 22A, the error detector 23, the loop filter 24, the PWM calculator 25, the low-pass filter 26, the operational amplifier 27, and the level variation detector 62A. As stated above, in the adaptive AGC 15A, the level variation detector 62A detects and evaluates receive level variation of the VSB modulated signal Svsb based on the stabilization signal SSp outputted from the loop filter 24 for setting the averaging coefficient of the adaptive averaging filter 22A.

However, in the adaptive AGC 15A_2, the level variation detector 62A detects and evaluates receive level variation of the VSB modulated signal Svsb based on the receive level variation adaptive control signal Sac outputted from the operational amplifier 27. Other than that, the adaptive AGC 15A_2 is basically the same in structure and operation as the adaptive AGC 15A. Also, the VSB demodulation apparatus DSp1 incorporating the adaptive AGC 15A_2 therein is basically the same in operation as the VSB demodulation apparatus DSp1 incorporating the adaptive AGC 15A therein.

Second Embodiment

Figure 8:
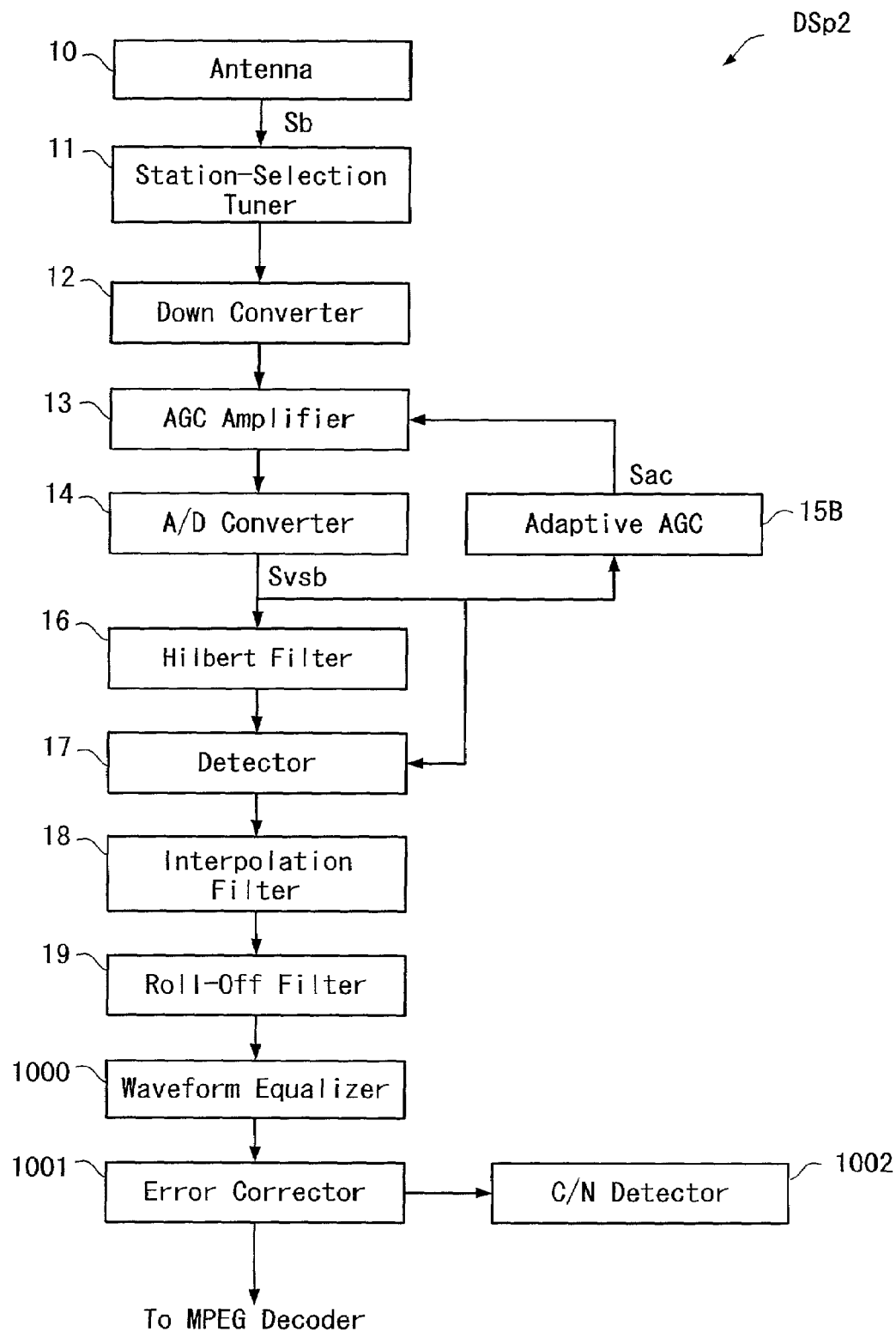
FIG. 8 is a block diagram showing a VSB demodulation apparatus according to a second embodiment of the present invention.

With reference to FIGS. 8 through 14, a VSB demodulation apparatus according to the second embodiment of the present invention is described below. As shown in FIG. 8, a VSB demodulation apparatus DSp2 according to the present embodiment is similar in structure to the VSB demodulation apparatus DSp1 already described with reference to FIG. 1, except that the adaptive AGC 15A is replaced by an adaptive AGC 15B.

Figure 9:
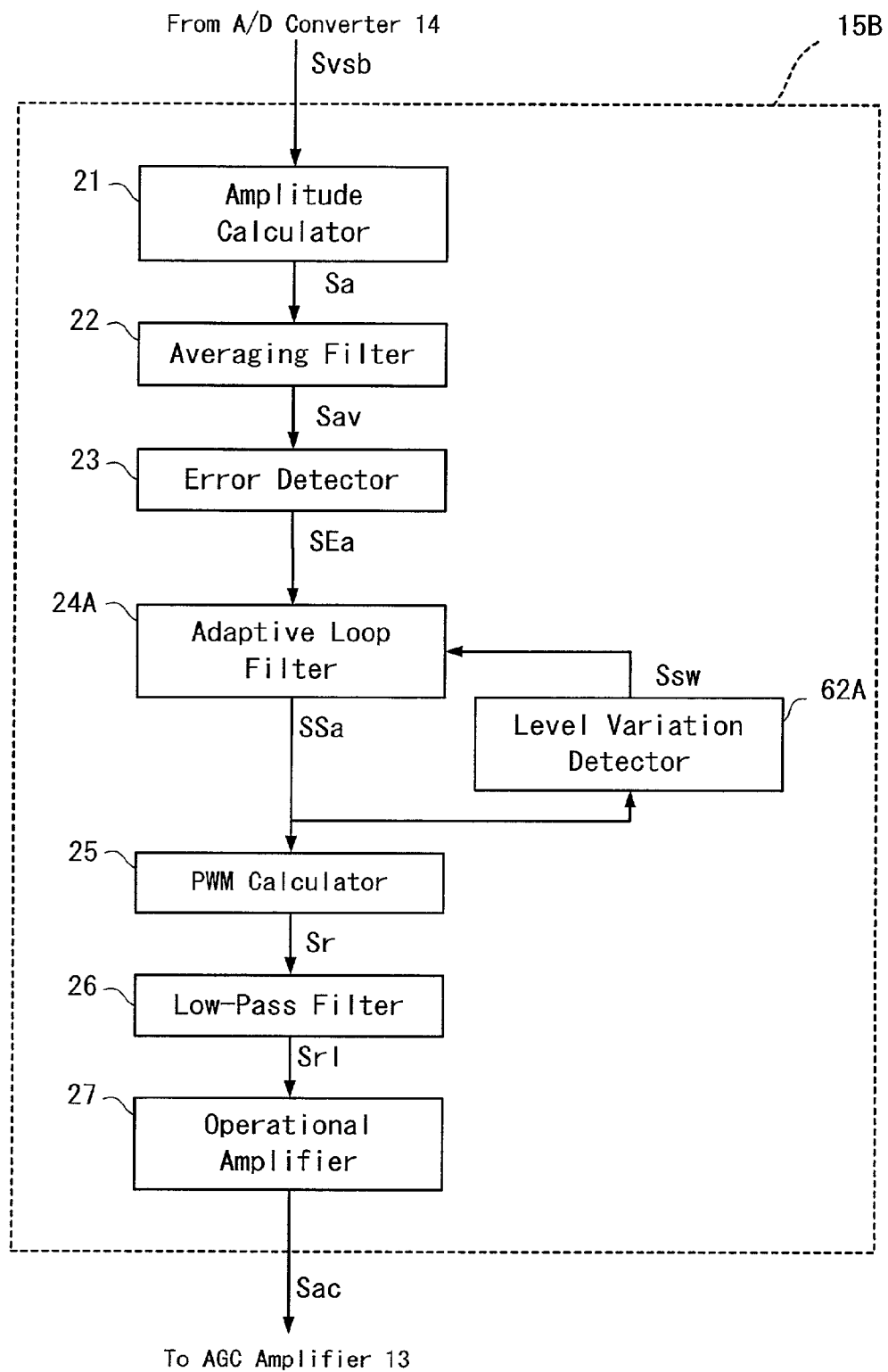
FIG. 9 is a block diagram showing the detailed structure of an adaptive AGC of FIG. 8.

With reference to FIG. 9, the adaptive AGC 15B is now described. The adaptive AGC 15B is similar in structure to the adaptive AGC 15A shown in FIG. 2, except that the adaptive averaging filter 22A is replaced by an averaging filter 22 and the loop filter 24 is replaced by an adaptive loop filter 24A. In other words, unlike the adaptive AGC 15A, in the adaptive AGC 15B, the averaging filter 22 carries out average-filtering on the amplitude signal Sa received from the amplitude calculator 21 with predetermined averaging coefficients irrespectively of receive level variation of the VSB modulated signal Svsb.

On the other hand, the adaptive loop filter 24A adaptively changes the integral coefficient based on the level variation signal Ssw received from the level variation detector 62A, and carries out loop filtering on the average amplitude error signal SEa received from the error detector 23 for generating the adaptive stabilizations signal SSa. In this sense, the level variation signal Ssw can be regarded as an integral coefficient control signal.

Figure 10:
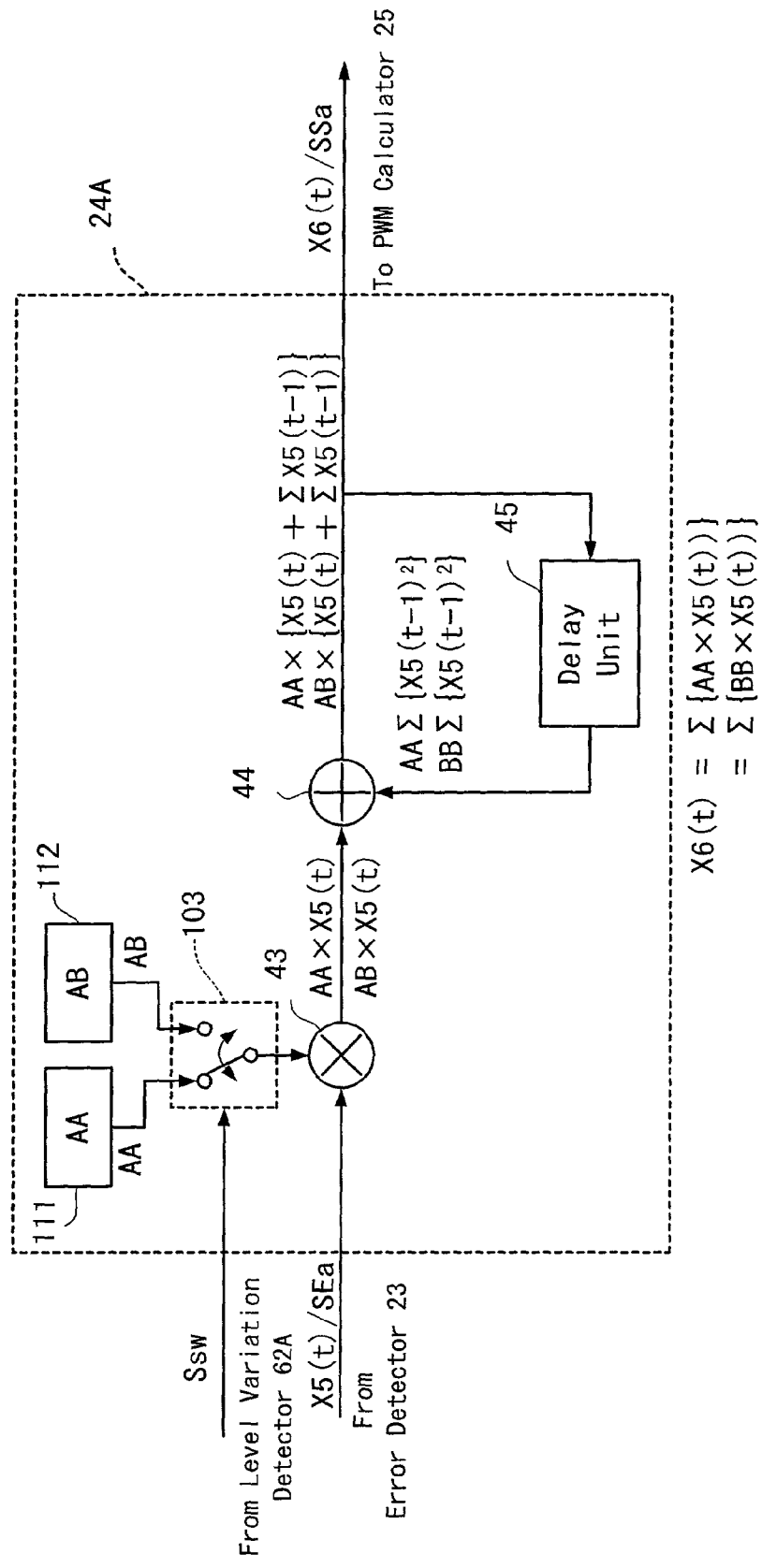
FIG. 10 is a block diagram showing the detailed structure of an adaptive loop filter 24A of FIG. 9.

With reference to FIG. 10, the adaptive loop filter 24A is described. The adaptive loop filter 24A includes a multiplier 43, an adder 44, a delay unit 45, a small-level-variation integral coefficient provider 111, a large-level-variation integral coefficient provider 112, and a switch 103. The small-level-variation integral coefficient provider (hereinafter referred to as SL integral coefficient provider) 111 holds a small-level-variation integral coefficient AA that is suitable when the level variation is small, and outputs the coefficient AA upon request. The large-level-variation integral coefficient provider (hereinafter referred to as LL integral coefficient provider) 112 holds a large-level-variation integral coefficient AB that is suitable when the level variation is large, and outputs the coefficient AB upon request.

The switch 103 is connected to an output port of the SL integral coefficient provider 111, an output port of the LL integral coefficient provider 112, an input port of the multiplier 43, and the level variation detector 62A. Based on the level variation signal Ssw received from the level variation detector 62A, the switch 103 selects either one output port of the SL integral coefficient provider 111 or the LL integral coefficient provider 112 for connecting the selected output port to the input port of the multiplier 43. As a result, depending upon the level variation signal Ssw, the coefficient AA or AB is supplied to the adder 44.

The processing in the adaptive loop filter 24A is described below, where the average amplitude error signal SEa is represented as X5(t), and the stabilization signal SSa outputted from the adaptive loop filter 24A is as X6(t).

First, consider the case where the value of the level variation signal Ssw is smaller than a level variation threshold Lth, that is, the receive level variation of the VSB modulated signal Svsb is relatively small. In this case, the switch 103 selects the SL integral coefficient provider 111. As a result, the multiplier 43 is supplied with the small-level-variation integral coefficient AA (hereinafter simply referred to as "AA" unless otherwise required). The multiplier 43 multiplies AA received from the switch 103 by X5(t) received from the error detector 23, and outputs AA×X5(t) to the adder 44.

Consequently, the adder 44 adds AA×X5(t) outputted from the multiplier 43 and X5(t−1) outputted from the delay unit 45 together to produce AA×X5(t)+X5(t−1). AA×X5(t)+X5(t−1) is supplied to the delay unit 45, and to the PWM calculator 25 as the stabilization signal SSa (X6(t)).

Next, consider the case where the value of the level variation signal Ssw is larger than the level variation threshold Lth, that is, the receive level variation of the VSB modulated signal Svsb is relatively large. In this case, the switch 103 selects the LL integral coefficient provider 112. As a result, the multiplier 43 is supplied with the large-level-variation integral coefficient AB (hereinafter simply referred to as "AB" unless otherwise required). The multiplier 43 multiplies AB received from the switch 103 by X5(t) received from the error detector 23, and outputs AB×X5(t) to the adder 44.

Consequently, the adder 44 adds AB×X5(t) outputted from the multiplier 43 and X5(t−1) outputted from the delay unit 45 together to produce AB×X5(t)+X5(t−1). AB×X5(t)+X5(t−1) is supplied to the delay unit 45, and to the PWM calculator 25 as the stabilization signal SSa (X6(t)).

Therefore, the following signal relation holds as represented by the following equation (5).

$$X6(t) = \sum \{AA \times X5(t)\} \\ = \sum \{AB \times X5(t)\} \qquad (5)$$

Figure 11:
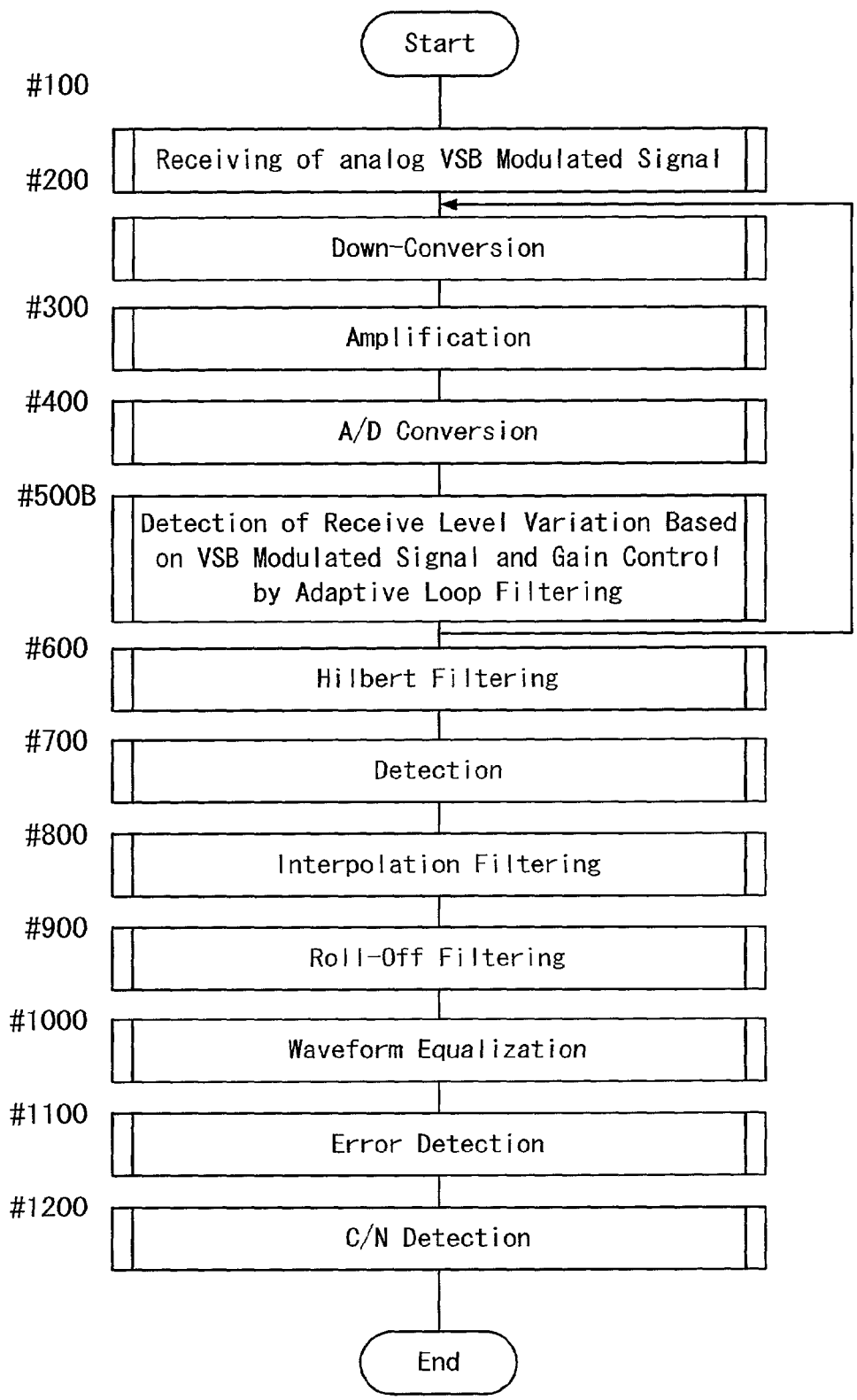
FIG. 11 is a flowchart showing the main operation of the VSB demodulation apparatus of FIG. 8.

With reference to FIG. 11, the main operation of the VSB demodulation apparatus DSp2 according to the present embodiment is described. The main operation of the VSB demodulation apparatus DSp2 is the same as that of the VSB demodulation apparatus DSp1 described with reference to FIG. 4, except that step #500A is replaced by step #500B, both steps called "detection of receive level variation based on the VSB modulated signal and gain control by adaptive loop filtering" subroutine.

In the VSB demodulation apparatus DSp2, the adaptive AGC 15B appropriately sets, in step #500B, the integral coefficient for the adaptive loop filter 24A based on receive level variation of the VSB modulated signal generated in step #400. With this, the adaptive AGC 15B controls the gain of the AGC amplifier 13 in step #300. Thus, the VSB modulated signal Svsb is amplified with gain appropriate to receive level variation, thereby enabling digital signal demodulation with high quality.

Figure 12:
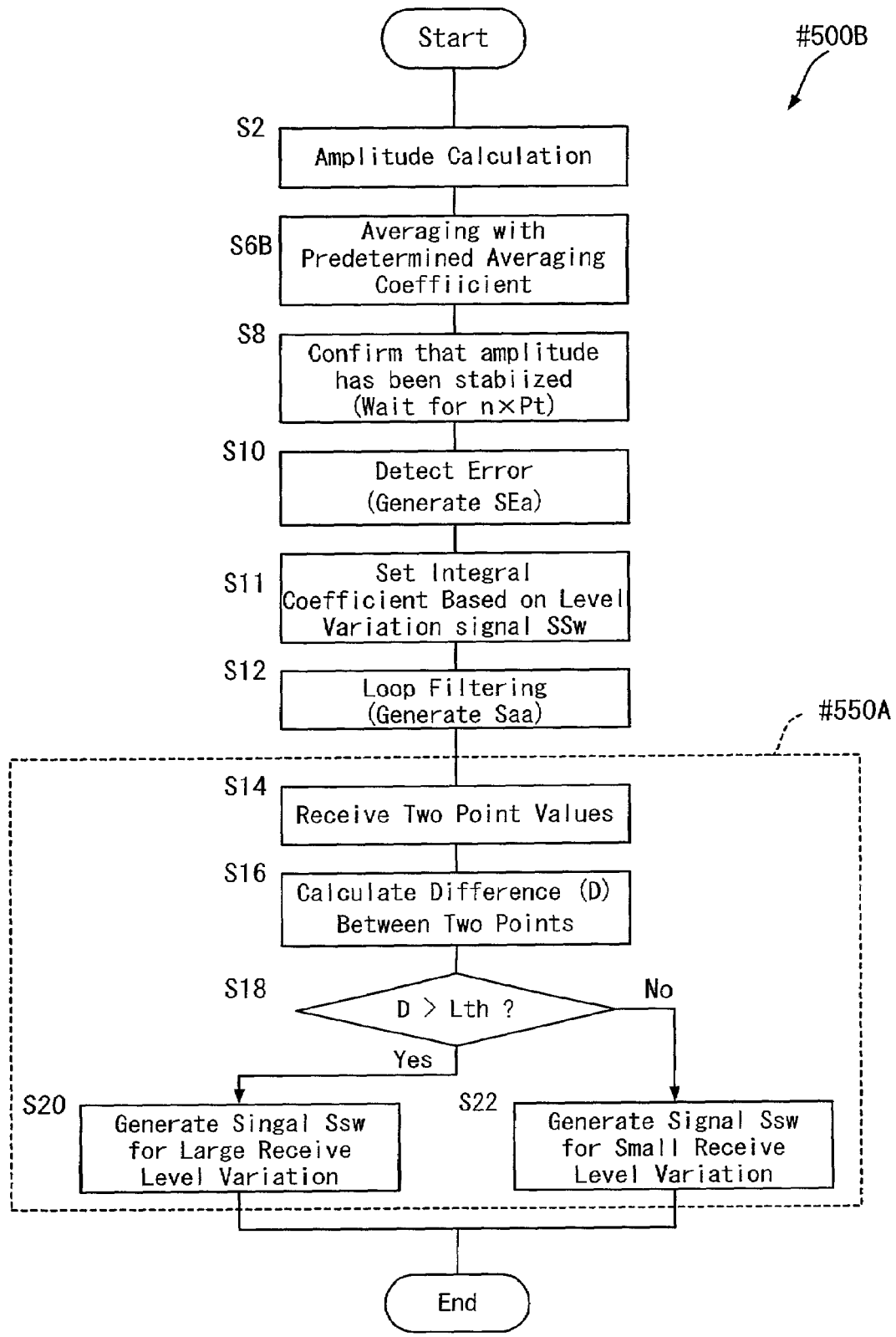
FIG. 12 is a flowchart showing the detailed operation of step #500B of FIG. 11.

Next, with reference to a flowchart shown in FIG. 12, the above step #500B, "detection of receive level variation based on the VSB modulated signal and gain control by adaptive loop filtering" subroutine, is described in detail. As is evident from FIG. 12, the processing in this subroutine is the same as that in the subroutine of step #500A shown in FIG. 5, except that steps S4A and S6 are replaced by step S6B, and step S11 is inserted between steps S10 and S12.

More specifically, when the VSB modulations signal Svsb generated in step #400 is supplied for the A/D converter 14 to the amplitude calculator 21 of the adaptive AGC 15B, the process of step #500B starts. Then, in step S2, the amplitude calculator 21 calculates the amplitude of the received VSB modulated signal Svsb, and generates an amplitude signal Sa for output to the adaptive averaging filter 22. Then, the procedure goes to a next step S6B.

In step S6B, the averaging filter 22 averages the amplitude signal Sa based on a predetermined averaging coefficient to produce an averaged amplitude signal Sav. The averaged amplitude signal Sav is supplied to the error detector 23. Then, the procedure goes to the above described step S8, and then step S10. In step S10, an average amplitude error signal SEa is outputted to the loop filter 24A. Then, the procedure goes to the next step S11.

In step S11, the adaptive loop filter 24A sets either one of the coefficients AA or AB depending upon the level variation signal Ssw received from the level variation detector 62A. Similarly to the first embodiment, in the second embodiment, the level variation signal Ssw is so set to initial indicate large level variation. Therefore, when step S11 is carried out for the first time after the VSB demodulation apparatus DSp2 starts to operate, the large-level-variation integral coefficient AB is selected. Then, the procedure goes to the next step S12.

In step S12, the adaptive loop filter 24A integrates the average amplitude error signal SEa generated in step S10 to generate the adaptive average amplitude signal Ssa for output to the level variation detector 62A. Then, step #550A including steps S14, S16, S18, S20, and S22 already described in the first embodiment is carried out, wherein the level variation detector 62A detects and evaluates receive level variation of the VSB modulated signal Svsb.

The level variation detector 62A generates and outputs, in step S20 or S22, the level variation signal Ssw indicative of large or small receive level variation. Consequently, when the process of step S11 is again carried out in the next control cycle t, the small-level-variation integral coefficient AA or the large-level-variation integral coefficient AB is set in the adaptive loop filter 24A based on the level variation signal Ssw generated in step S20 or S22 in the previous control cycle t−1. Note that the number of integral coefficients adaptively switched based on the receive level of the VSB modulated signal Svsb is not limited to two, "small" and "large", but may be three or more, which is similar to the number of averaging coefficients in the first embodiment.

Figure 13:
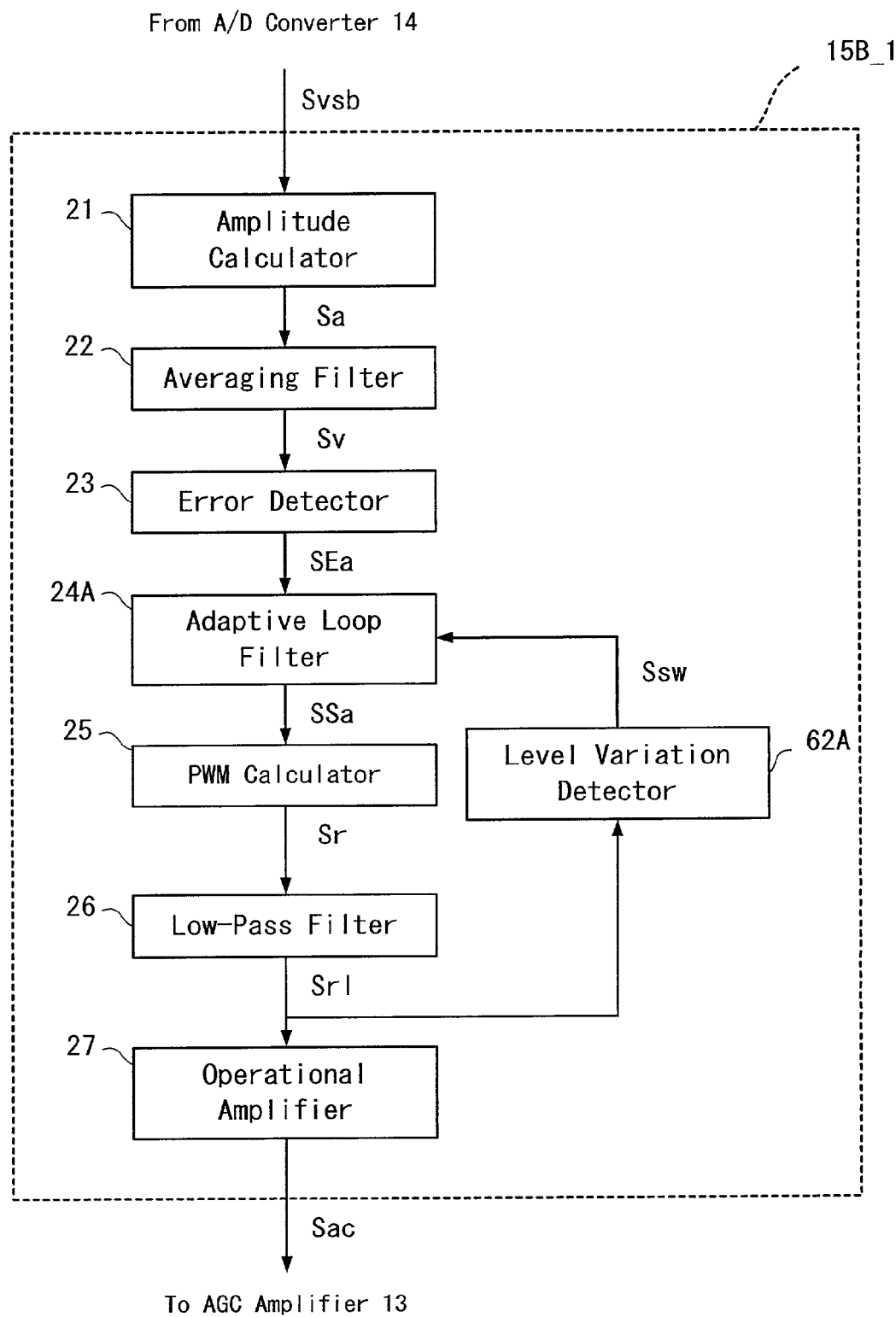
FIG. 13 is a block diagram showing a first modification of an adaptive AGC of FIG. 9.

With reference to FIG. 13, a first modification of the adaptive AGC 15B according to the present embodiment is now described. An adaptive AGC 15B_1 according to the first modification includes, like the adaptive AGC 15B shown in FIG. 9, the amplitude calculator 21, the averaging filter 22, the error detector 23, the adaptive loop filter 24A, the PWM calculator 25, the low-pass filter 26, the operational amplifier 27, and the level variation detector 62A. As stated above, in the adaptive AGC 15B, the level variation detector 62A detects and evaluates receive level variation of the VSB modulated signal Svsb based on the adaptive stabilization signal SSa received from the adaptive loop filter 24A for setting the integral coefficient of the adaptive loop filter 24A.

However, in the adaptive AGC 15B_1, the level variation detector 62A detects and evaluates receive level variation of the VSB modulated signal Svsb based on the low-frequency square-wave signal Srl outputted from the low-pass filter 26. Other than that, the adaptive AGC 15B_1 is basically the same in structure and operation as the adaptive AGC 15B. Also, the VSB demodulation apparatus DSp2 incorporating the adaptive AGC 15B_1 therein is basically the same in operation as the VSB demodulation apparatus DSp2 incorporating the adaptive AGC 15B therein.

Figure 14:
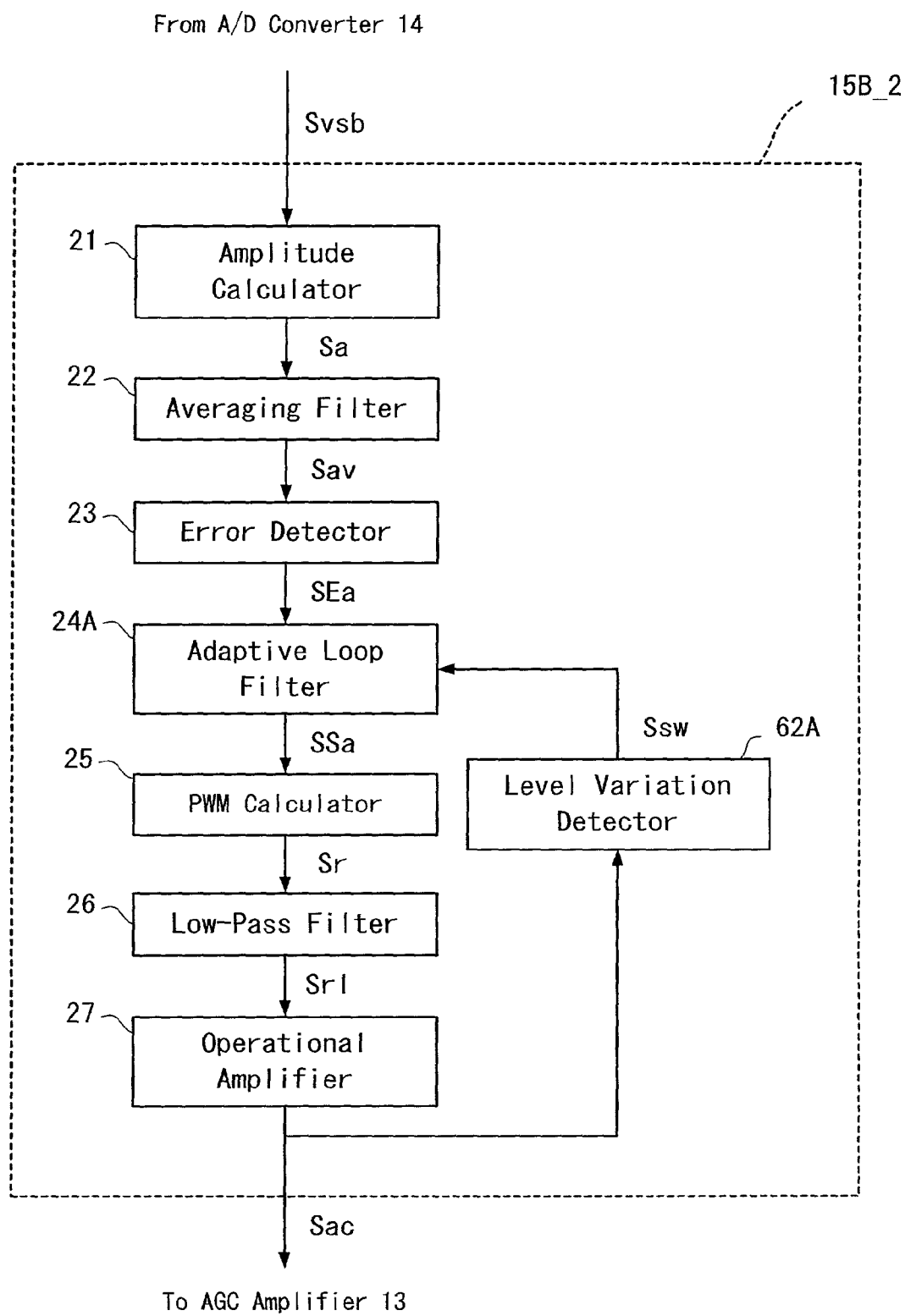
FIG. 14 is a block diagram showing a second modification of the adaptive AGC of FIG. 9.

With reference to FIG. 14, a second modification of the adaptive AGC 15B according to the present embodiment is described. An adaptive AGC 15B_2 according to the second modification includes, like the adaptive AGC 15B shown in FIG. 9, the amplitude calculator 21, the adaptive averaging filter 22, the error detector 23, the adaptive loop filter 24A, the PWM calculator 25, the low-pass filter 26, the operational amplifier 27, and the level variation detector 62A. As stated above, in the adaptive AGC 15B, the level variation detector 62A detects and evaluates receive level variation of the VSB modulated signal Svsb based on the output from the loop filter 24A for setting the integral coefficient of the adaptive loop filter 24A.

However, in the adaptive AGC 15B_2, the level variation detector 62A detects and evaluates receive level variation of the VSB modulated signal Svsb based on the output from the operational amplifier 27. Other than that, the adaptive AGC 15B_2 is basically the same in structure and operation as the adaptive AGC 15B. Also, the VSB demodulation apparatus DSp2 incorporating the adaptive AGC 15B_2 therein is basically the same in operation as the VSB demodulation apparatus DSp2 incorporating the adaptive AGC 15B therein.

Third Embodiment

Figure 15:
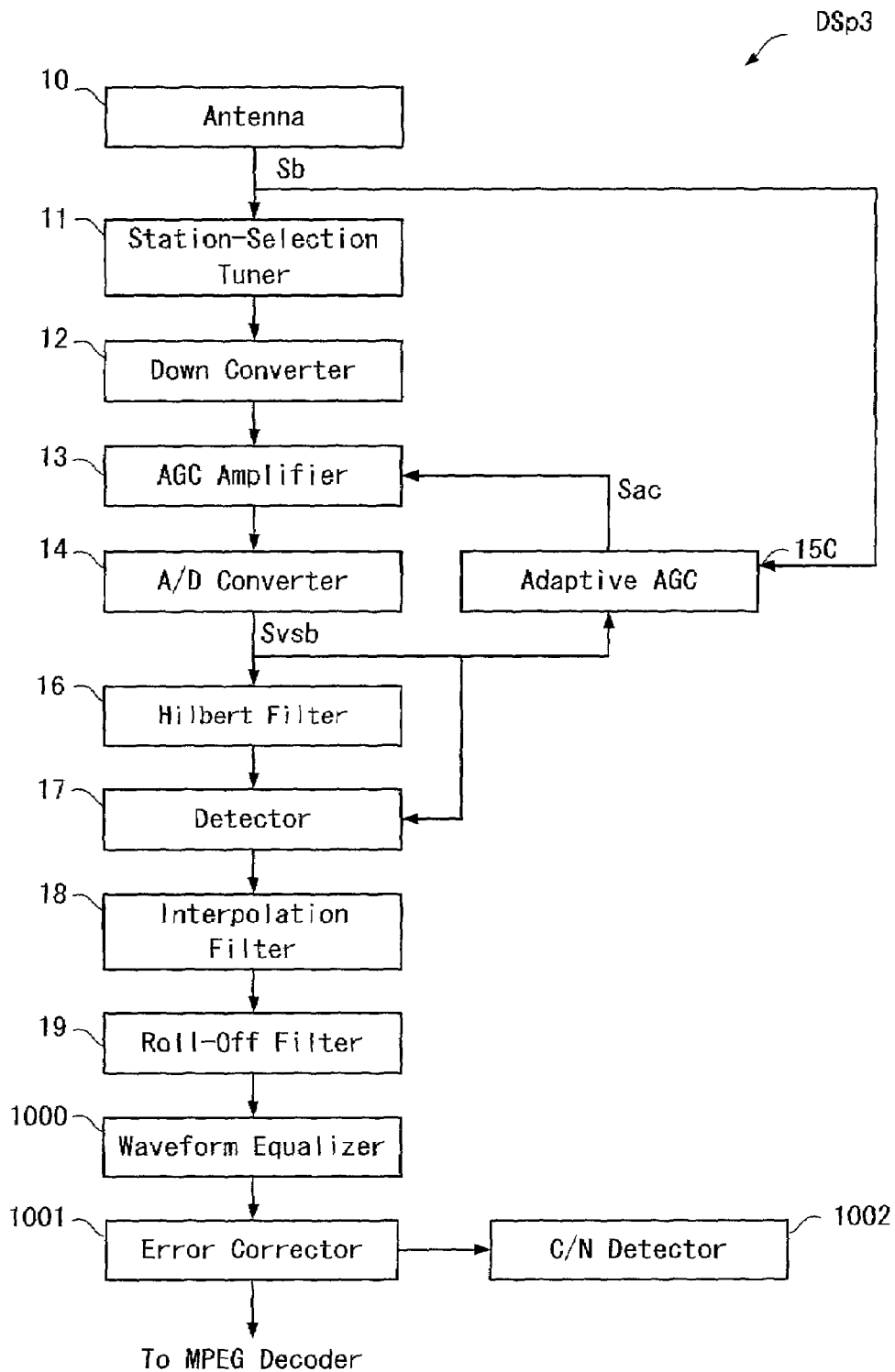
FIG. 15 is a block diagram showing a VSB demodulation apparatus according to a third embodiment of the present invention.

With reference to FIGS. 15, 16, 17, 18, and 19, a VSB demodulation apparatus according to the third embodiment of the present invention is described below. First, as shown in FIG. 15, a VSB demodulation apparatus DSp3 is similar in structure to the VSB demodulation apparatus DSp1 already described with reference to FIG. 1, except that the adaptive AGC 15A is replaced by an adaptive AGC 15C, and the adaptive AGC 15C is further connected to the antenna 10.

Figure 16:
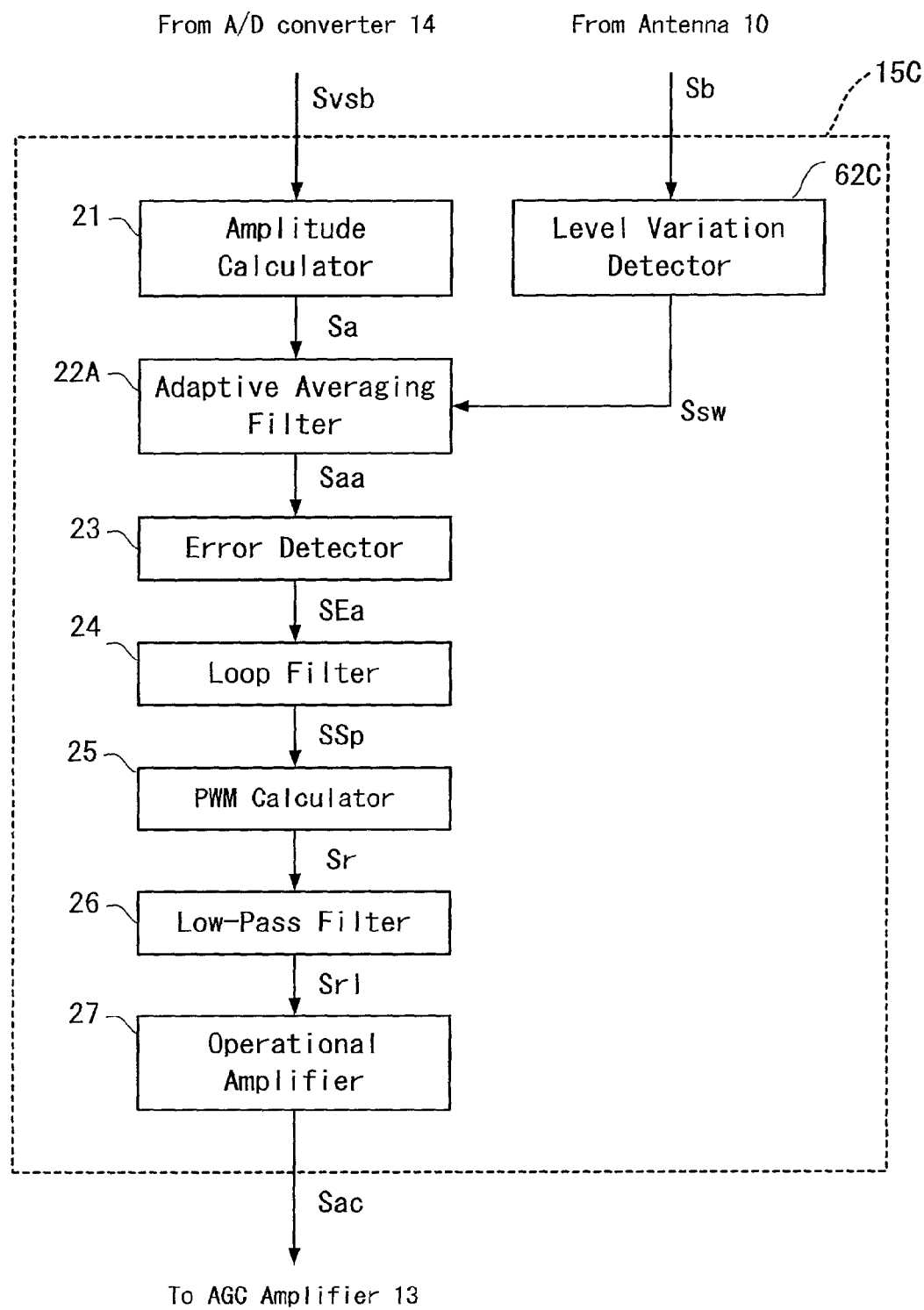
FIG. 16 is a block diagram showing the detailed structure of an adaptive AGC of FIG. 15.

With reference to FIG. 16, the adaptive AGC 15C is described. The adaptive AGC 15C includes, like the adaptive AGC 15A shown in FIG. 2, the amplitude calculator 21, the adaptive averaging filter 22A, the error detector 23, the loop filter 24, the PWM calculator 25, the low-pass filter 26, and the operational amplifier 27. However, the level variation detector 62A is replaced by a level variation detector 62C. The level variation detector 62C is similar in structure to the level variation detector 62A, but is connected not to the loop filter 24 but to the antenna 10. That is, the level variation detector 62C detects and evaluates receive level variation based not on the stabilization signal SSp, but on the VSB modulated signal wave Sb, which is also supplied to the station-selection tuner 11 for tuning. Then, the level variation detector 62C generates a level variation signal Ssw for output to the adaptive averaging filter 22A. The stabilization signal SSp is used for the adaptive AGC 15C to operate normally.

Figure 17:
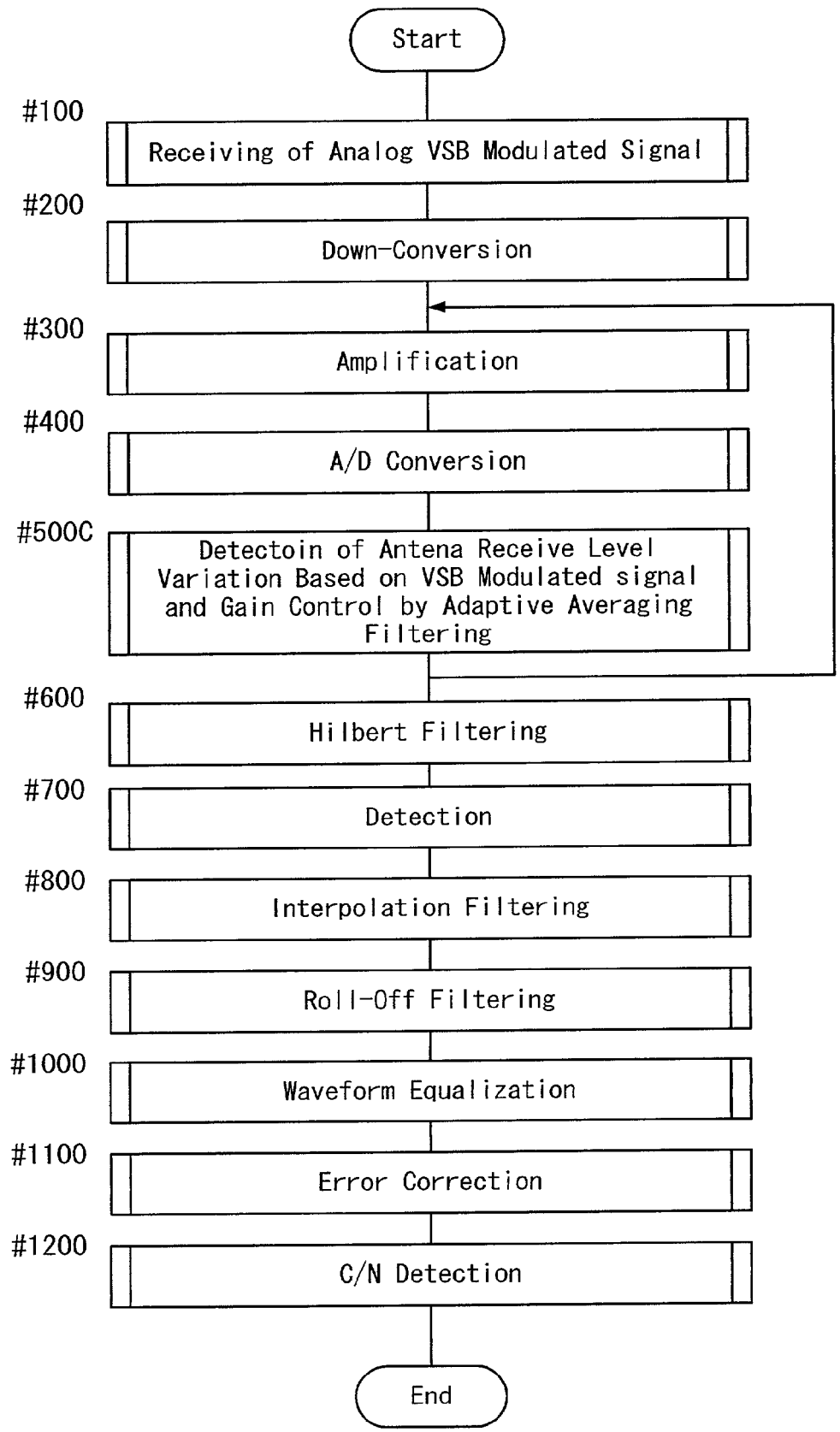
FIG. 17 is a flowchart showing the main operation of the VSB demodulation apparatus of FIG. 15.

With reference to FIG. 17, the main operation of the VSB demodulation apparatus DSp3 is described. The main operation of the VSB demodulation apparatus DSp3 is the same as that of the VSB demodulation apparatus DSp1 described with reference to FIG. 4, except that step #500A, "detection of receive level variation based on the VSB modulated signal and gain control by adaptive average filtering" subroutine, is replaced by step #500C, "detection of antenna receive level variation based on the VSB modulated signal wave and gain control by adaptive average-filtering" subroutine.

Figure 18:
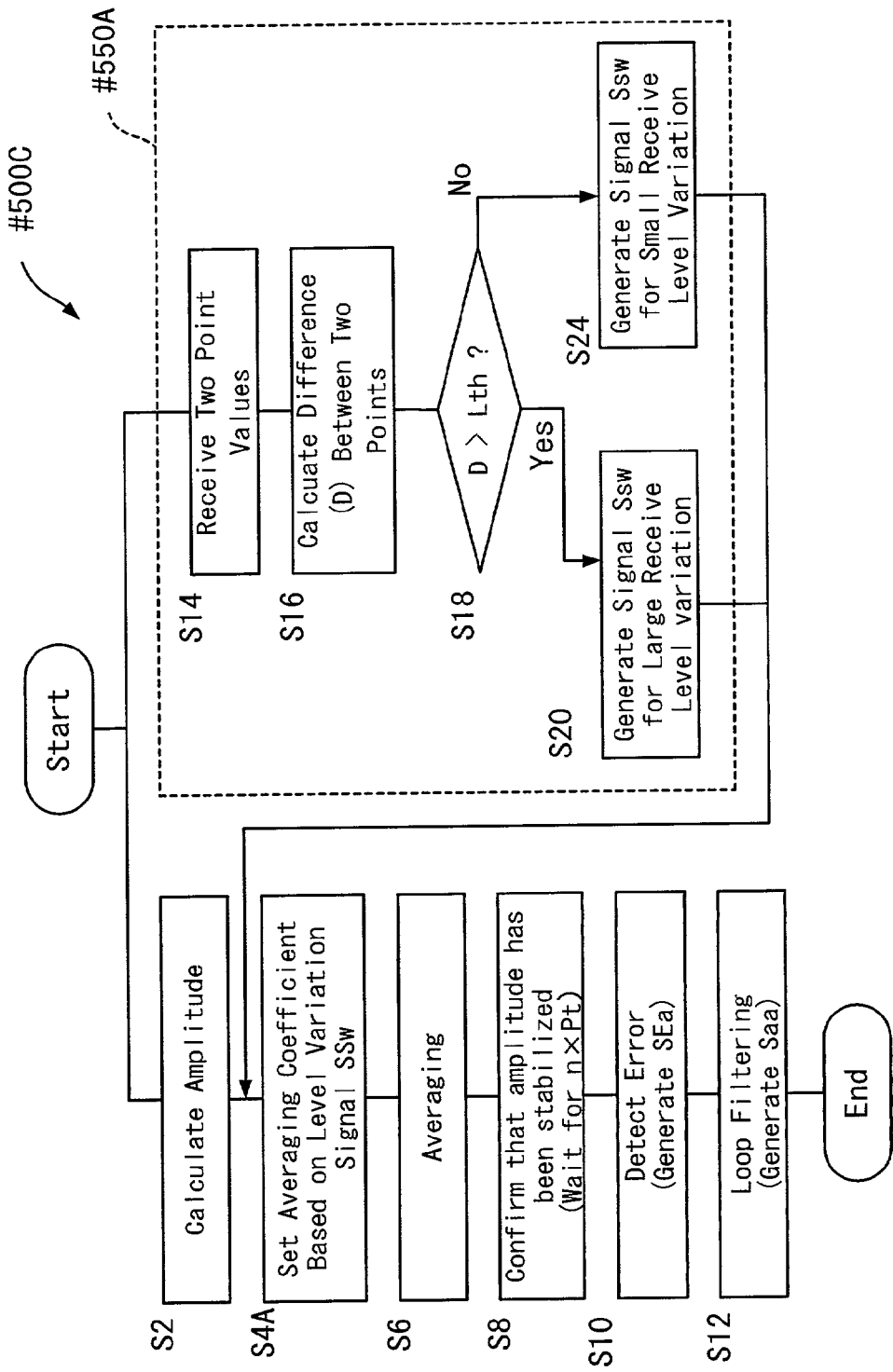
FIG. 18 is a flowchart showing the detailed operation of step #500C of FIG. 17.

Next, with reference to a flowchart shown in FIG. 18, described in detail is the above step #500C, "detection of antenna receive level variation based on the VSB modulated signal wave and gain control by adaptive average-filtering" subroutine, which is mainly carried out by the adaptive AGC 15C. As is evident from the FIG. 18, in the processing of this subroutine, step #550A, "detection and evaluation of receive level variation of the VSB modulated signal" subroutine, including steps S14, S16, S18, S20 and S22 is carried out concurrently with step S2 for generating the level variation signal Ssw. Then, the procedure goes the same as that in step #500A shown in FIG. 5, except that the averaging coefficient of the adaptive averaging filter 22A is set in step S4A based on the level variation signal Ssw.

The present embodiment is different from the first embodiment shown in FIG. 5 in that evaluation of receive level variation and generation of the level variation signal Ssw are carried out based on the receive wave received by the antenna but not yet being tuned in the station-selection tuner 11. In other words, what is processed in step #550A is the digital VSB modulated signal Svsb in the first embodiment, while the analog receive wave in the third embodiment. Other than that, the processing in step #550A is the same between the first and third embodiments. That is, in the present embodiment, the averaging coefficient of the adaptive averaging filter 22 is adaptively changed based on level variation of the VSB modulated signal wave Sb at the antenna 10, thereby enabling digital demodulation with high quality.

Figure 19:
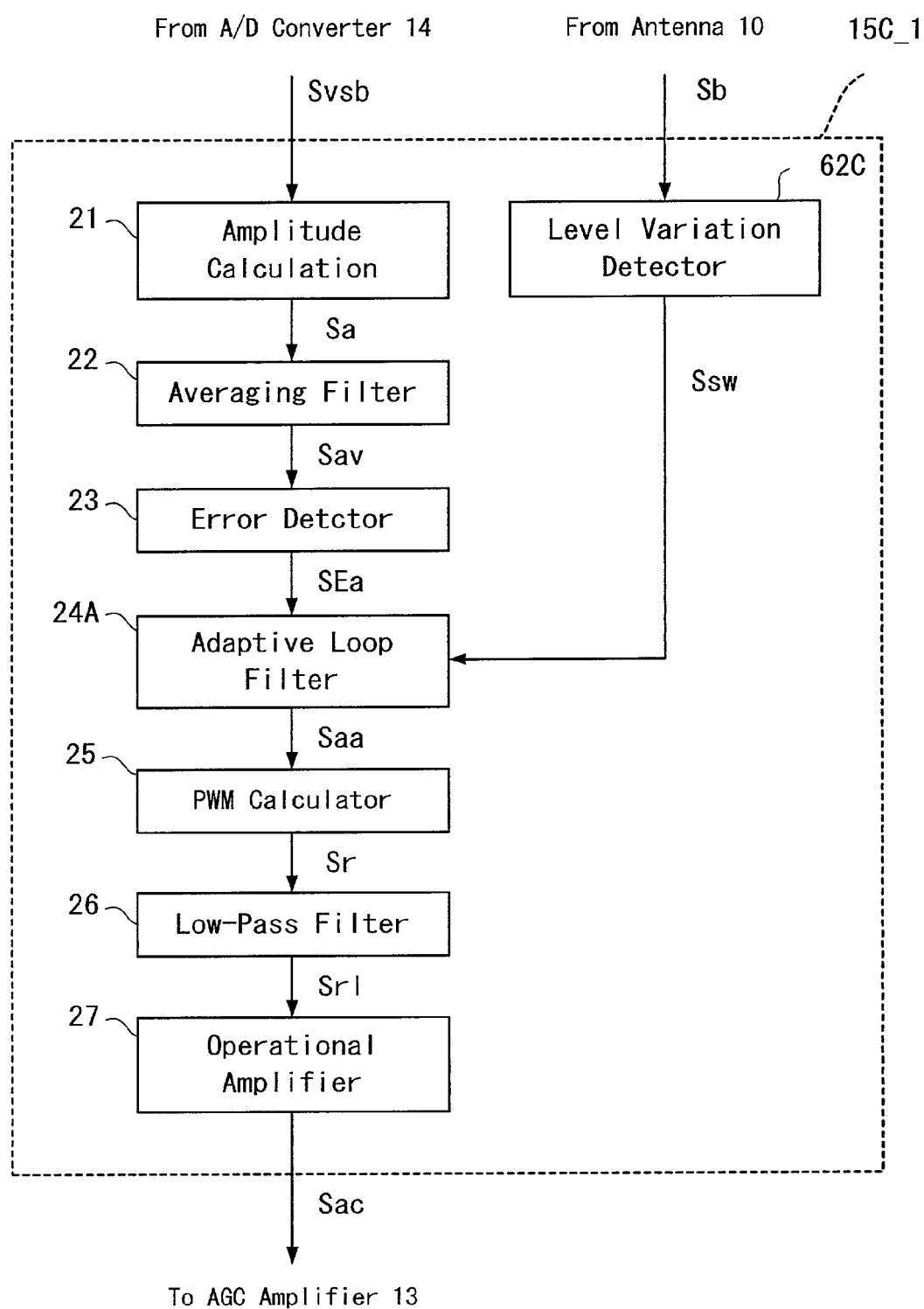
FIG. 19 is a block diagram showing one modification of the adaptive AGC of FIG. 15.

With reference to FIG. 19, one modification of the adaptive AGC 15C according to the present embodiment is described. An adaptive AGC 15C_1 according to the modification includes, like the adaptive AGC 15B shown in FIG. 9, the amplitude calculator 21, the averaging filter 22, the error detector 23, the adaptive loop filter 24A, the PWM calculator 25, the low-pass filter 26, and the operational amplifier 27. However, the level variation detector 62A is replaced by a level variation detector 62C. The level variation detector 62C is basically similar in structure to that level variation detector 62A. The difference therebetween is that the level variation detector 62A detects receive level variation of the VSB modulated signal outputted from the A/D converter 14, while the level variation detector 62C detects and evaluates receive level variation of the VSB modulated signal wave Sb received from the antenna 10 for setting the integral coefficient of the adaptive loop filter 24A.

Other than the above, the adaptive AGC 15C_1 is basically the same in structure and operation as the adaptive AGC 15B described in the second embodiment. Also, the VSB demodulation apparatus DSp3 incorporating the adaptive AGC 15C_1 therein is basically the same in operation as the VSB demodulation apparatus DSp2 incorporating the adaptive AGC 15B therein described in the second embodiment.

Fourth Embodiment

Figure 20:
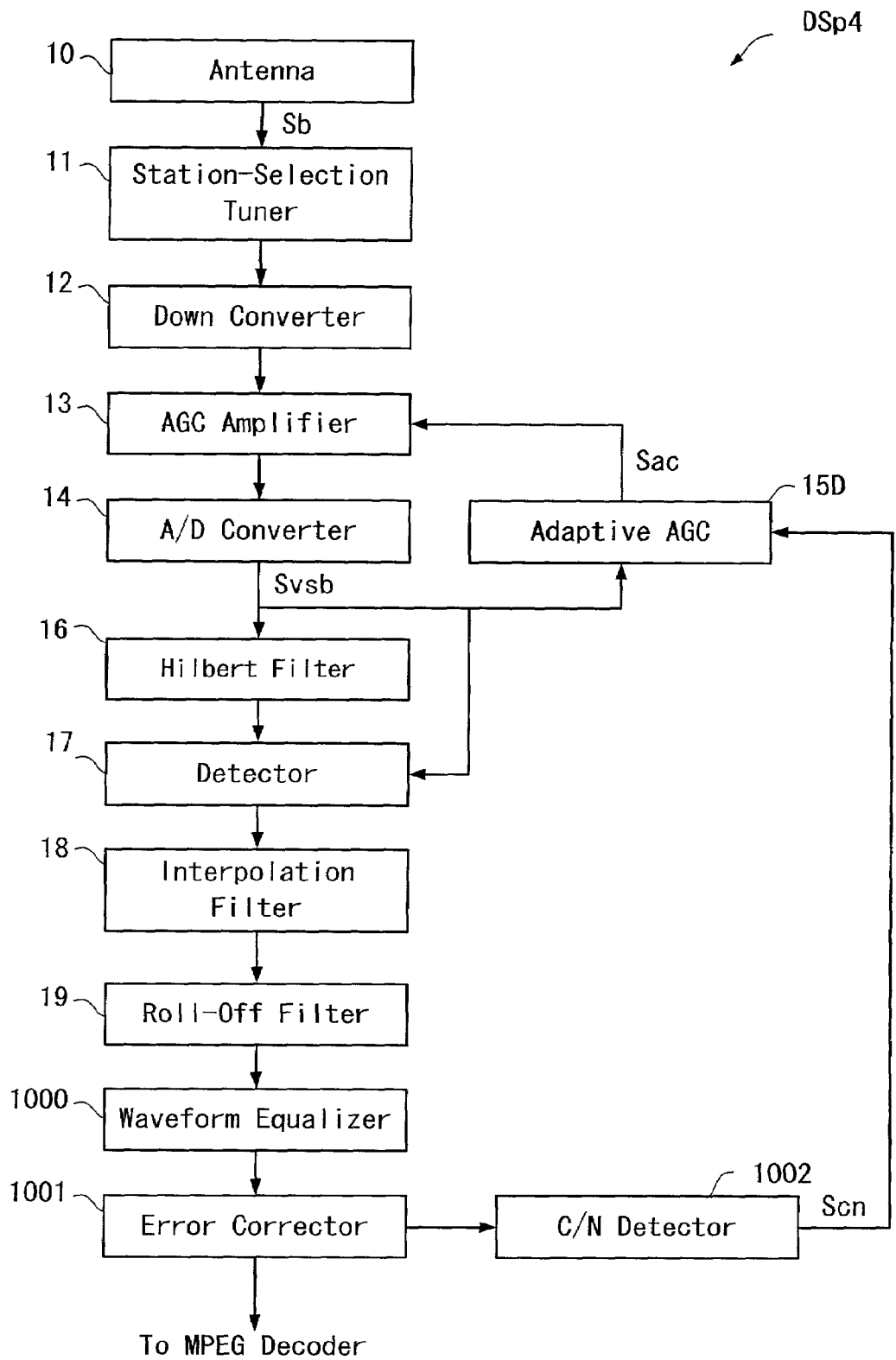
FIG. 20 is a block diagram showing a VSB demodulation apparatus according to a fourth embodiment of the present invention.

With reference to FIGS. 20, 21, 22, 23, and 24, a VSB demodulation apparatus according to the fourth embodiment of the present invention is described below. First, as shown in FIG. 20, a VSB demodulation apparatus DSp4 is similar in structure to the VSB demodulation apparatus DSp3 already described with reference to FIG. 15, except that the adaptive AGC 15C is replaced by an adaptive AGC 15D, and the adaptive AGC 15D is further connected to the C/N detector 1002 instead of the antenna 10. That is, the VSB demodulation apparatus DSp4 detects and evaluates receive level variation of the VSB modulated signal based on a C/N signal Scn outputted from the C/N detector 1002 for controlling the gain of the AGC amplifier 13.

Figure 21:
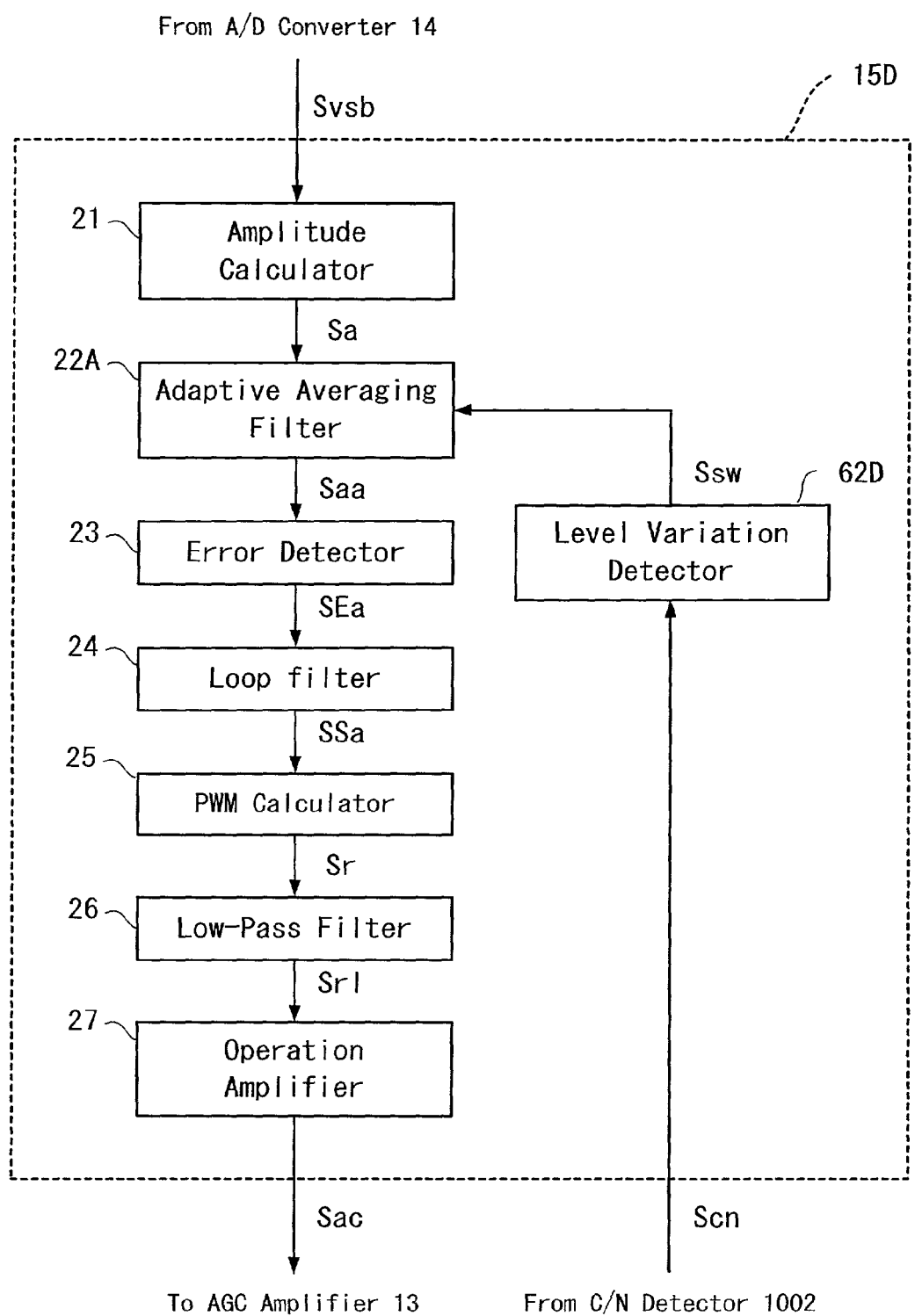
FIG. 21 is a block diagram showing the detailed structure of an adaptive AGC of FIG. 20.

With reference to FIG. 21, the adaptive AGC 15D is described. The adaptive AGC 15D includes, like the adaptive AGC 15A shown in FIG. 2, the amplitude calculator 21, the adaptive averaging filter 22A, the error detector 23, the loop filter 24, the PWM calculator 25, the low-pass filter 26, and the operational amplifier 27. However, the level variation detector 62A is replaced by a level variation detector 62D. Furthermore, the level variation detector 62D is connected not to the loop filter 24, but to the C/N detector 1002. That is, the level variation detector 62D detects and evaluates receive level variation based not on the stabilization signal SSa, but on C/N information Scn, Then, the level variation detector 62D generates a level variation signal Ssw for output to the adaptive averaging filter 22A.

Figure 22:
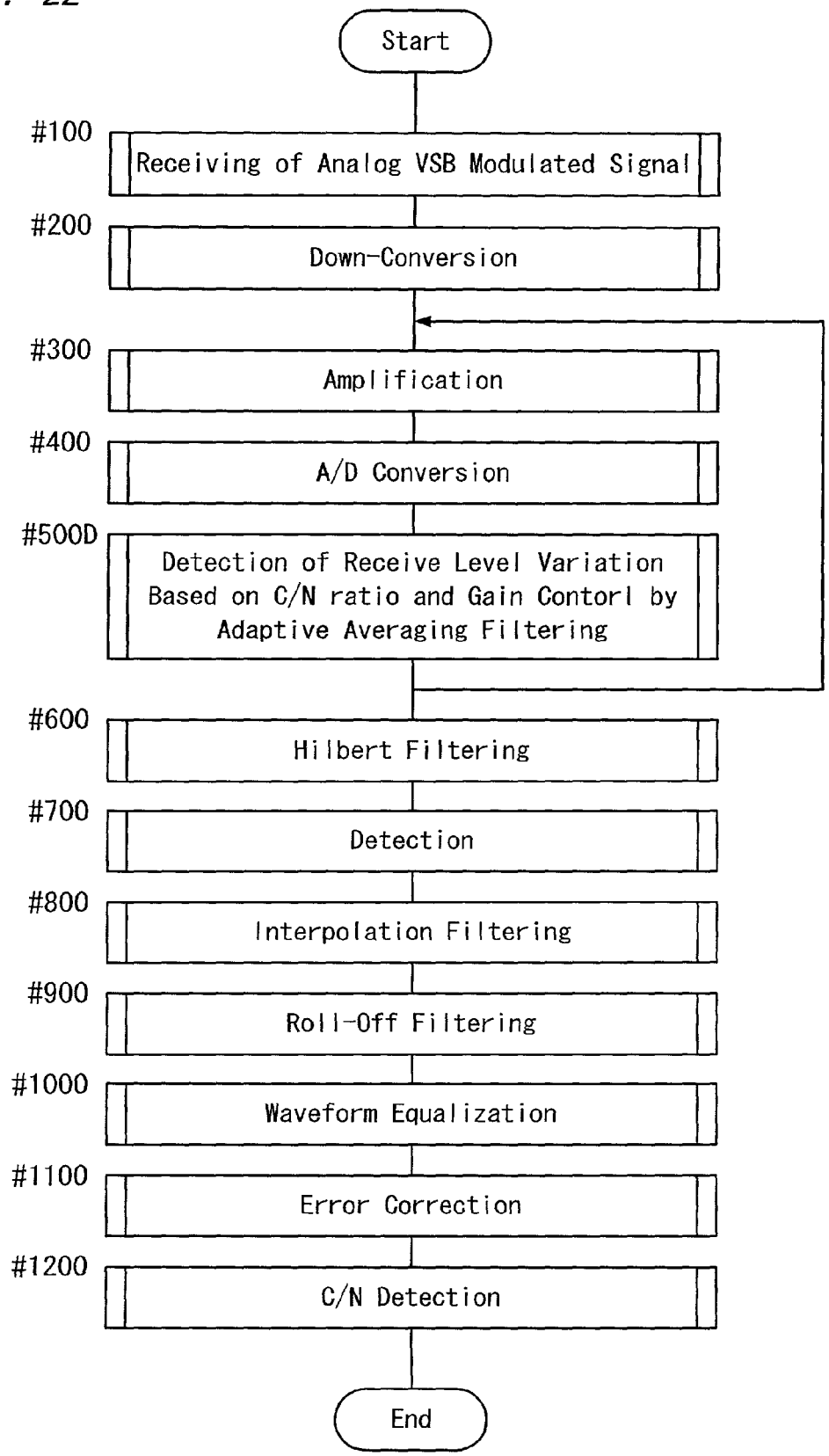
FIG. 22 is a flowchart showing the main operation of the VSB demodulation apparatus of FIG. 20.

With reference to FIG. 22, the main operation of the VSB demodulation apparatus DSp4 is described. The main operation of the VSB demodulation apparatus DSp4 is the same as that of the VSB demodulation apparatus DSp3 described with reference to FIG. 18, except that step #500C, "detection of antenna receive level variation based on the VSB modulated signal wave and gain control by adaptive average-filtering" subroutine, is replaced by step #500D, "detection of receive level variation based on C/N ratio and gain control by adaptive average-filtering" subroutine.

Figure 23:
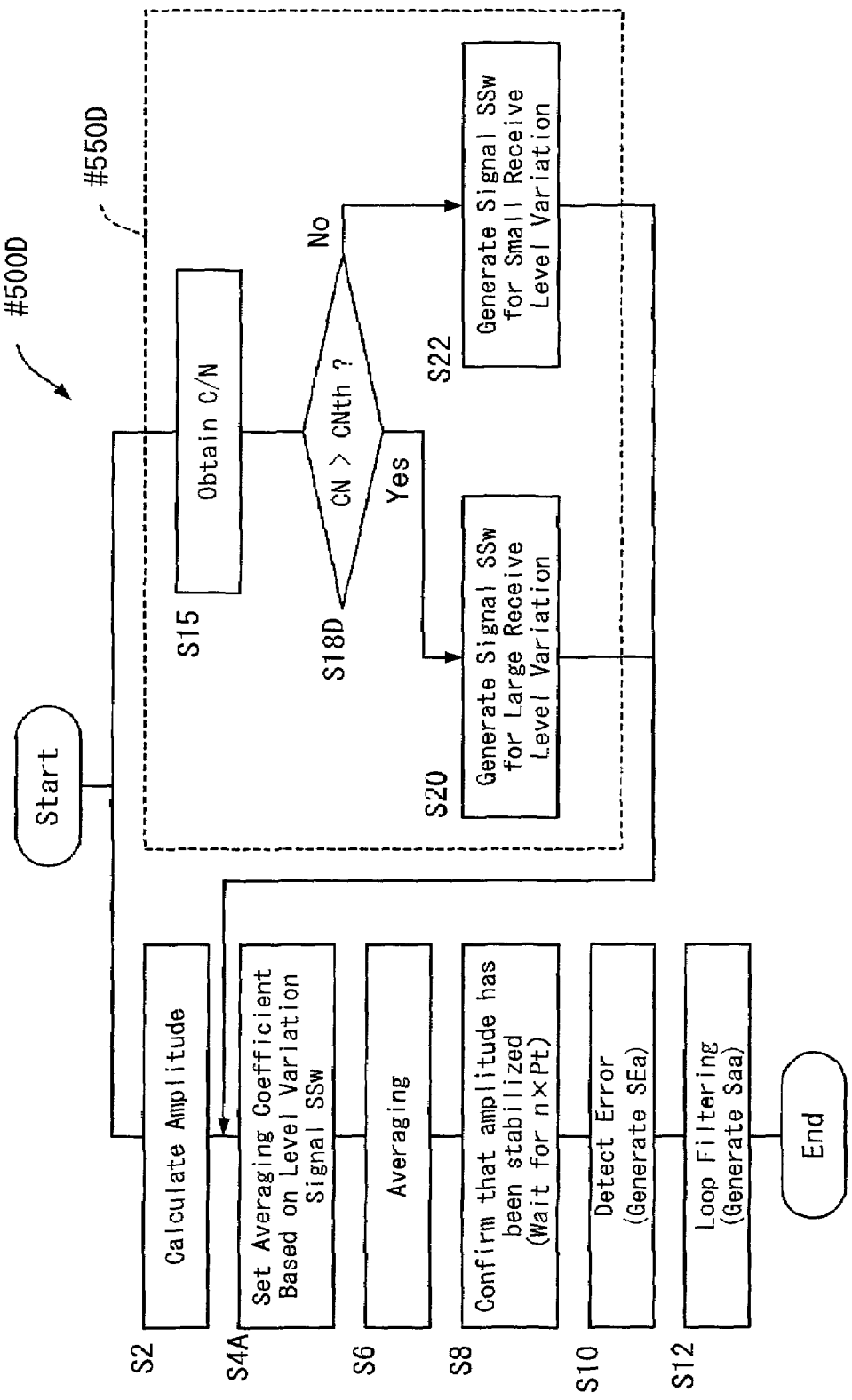
FIG. 23 is a flowchart showing the detailed operation of step #500D of FIG. 22.
Figure 24:
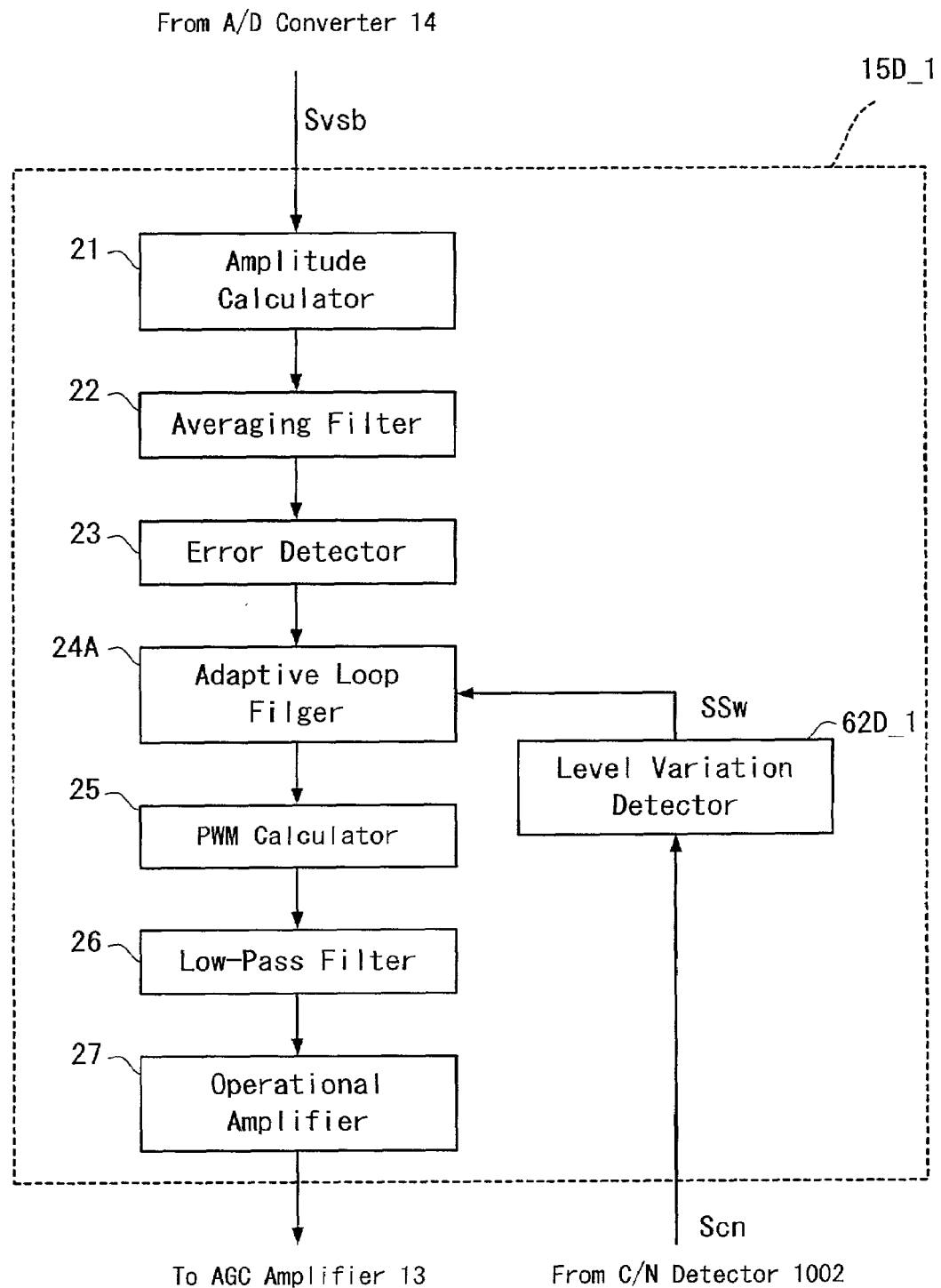
FIG. 24 is a block diagram showing one modification of the adaptive AGC of FIG. 21.
Figure 25:
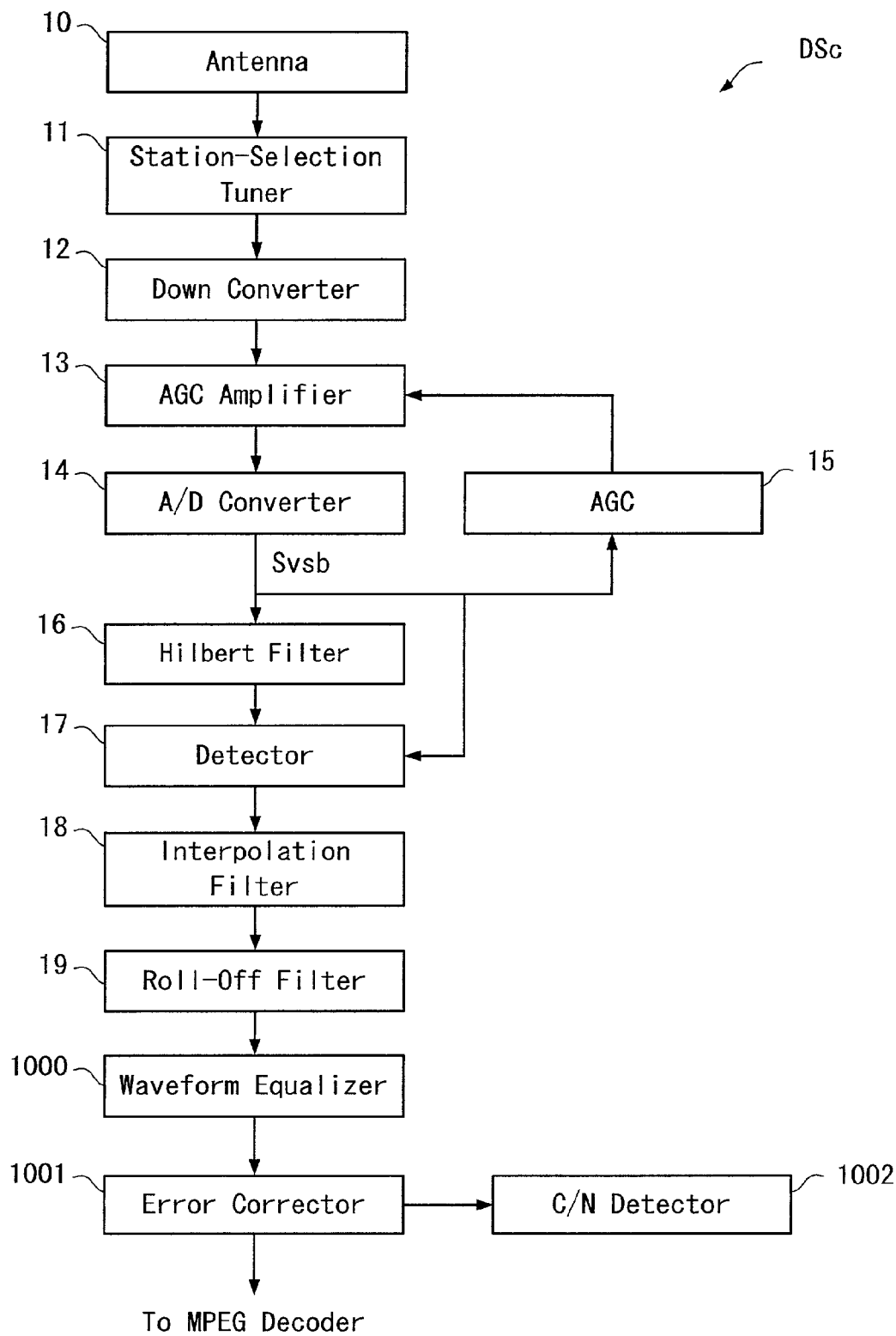
FIG. 25 is a block diagram showing a conventional VSB demodulation apparatus.
Figure 26:
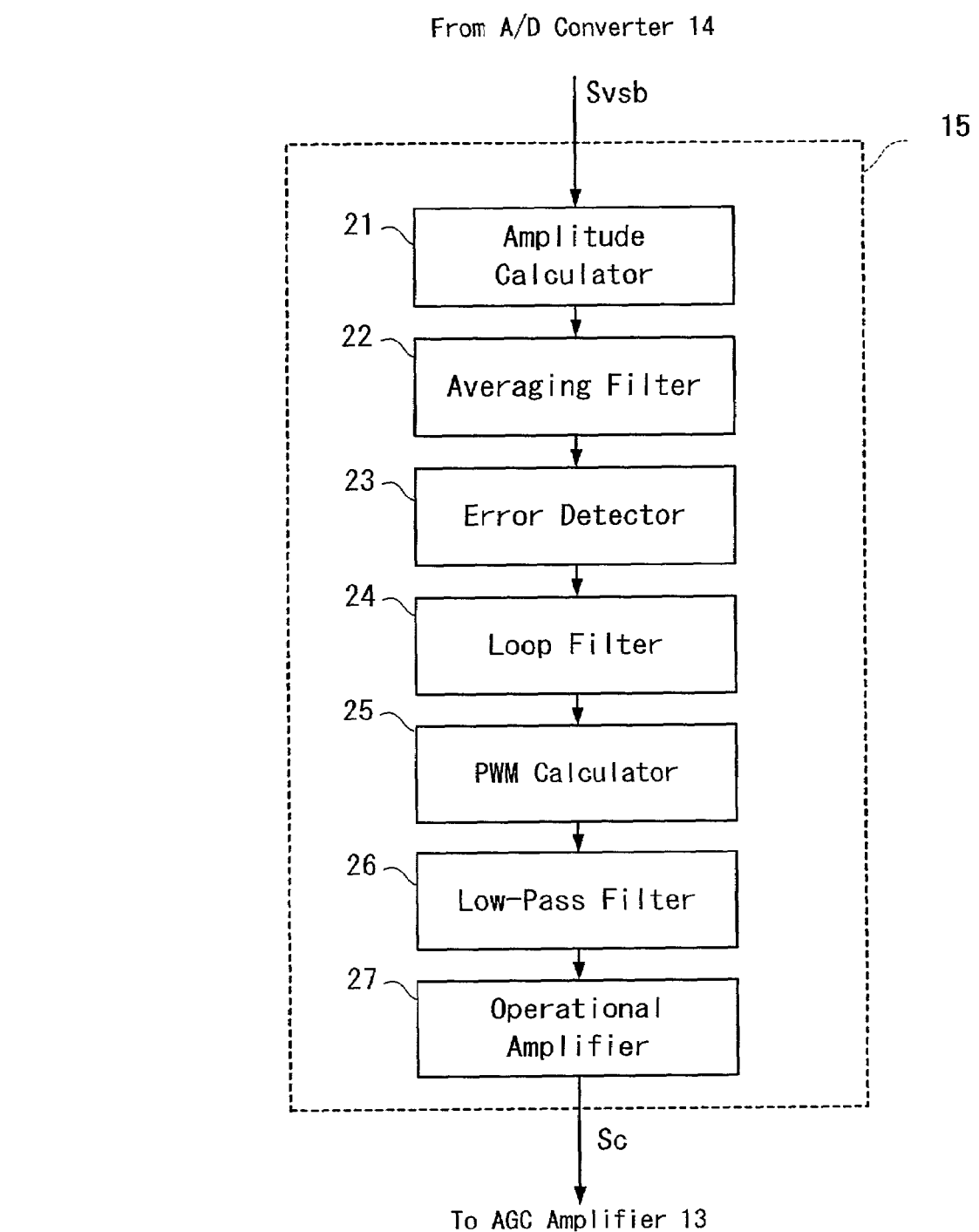
FIG. 26 is a block diagram showing the detailed structure of an adaptive AGC of FIG. 25.
Figure 27:
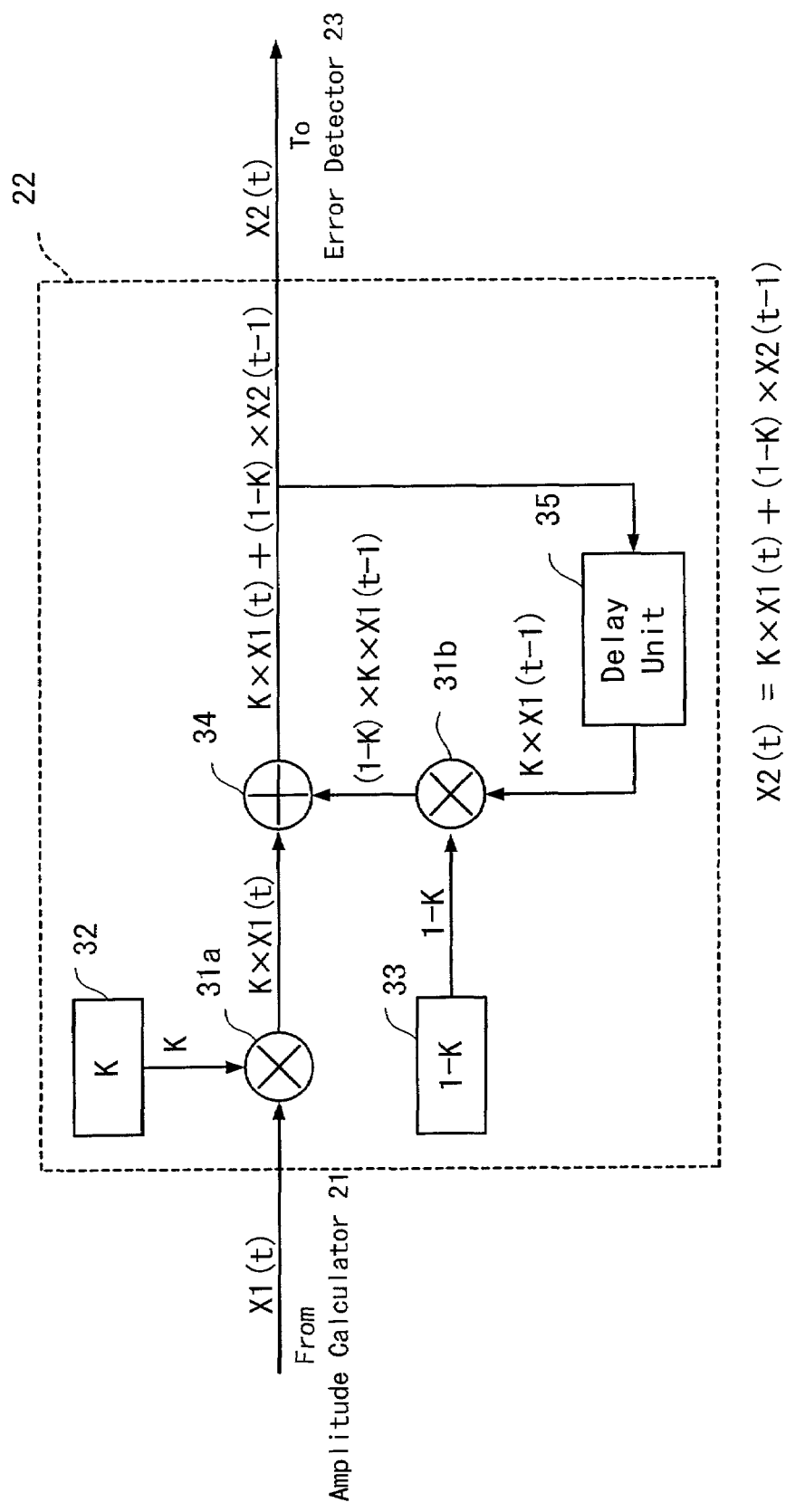
FIG. 27 is a block diagram showing the detailed structure of an averaging filter of FIG. 26.
Figure 28:
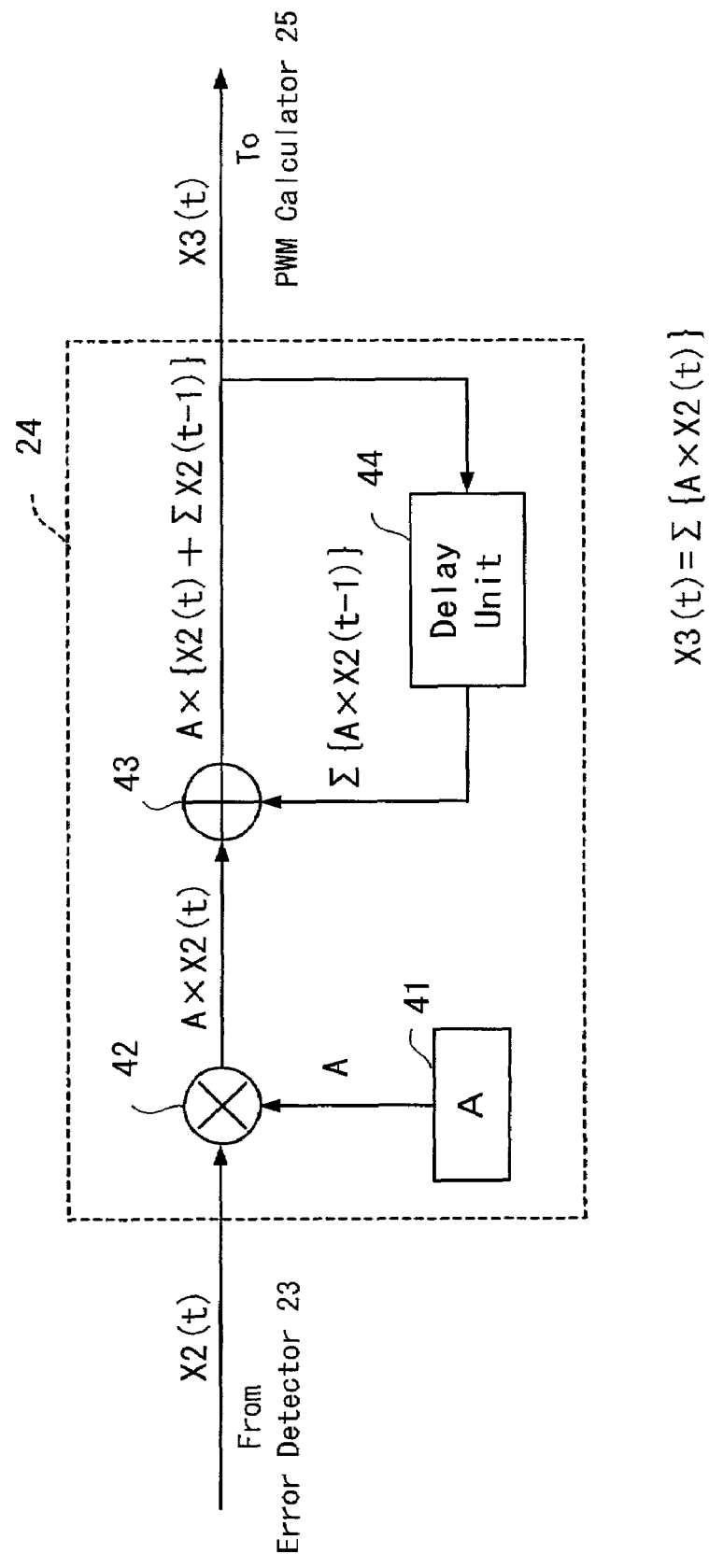
FIG. 28 is a block diagram showing the detailed structure of a loop filter of FIG. 26.
Figure 29:
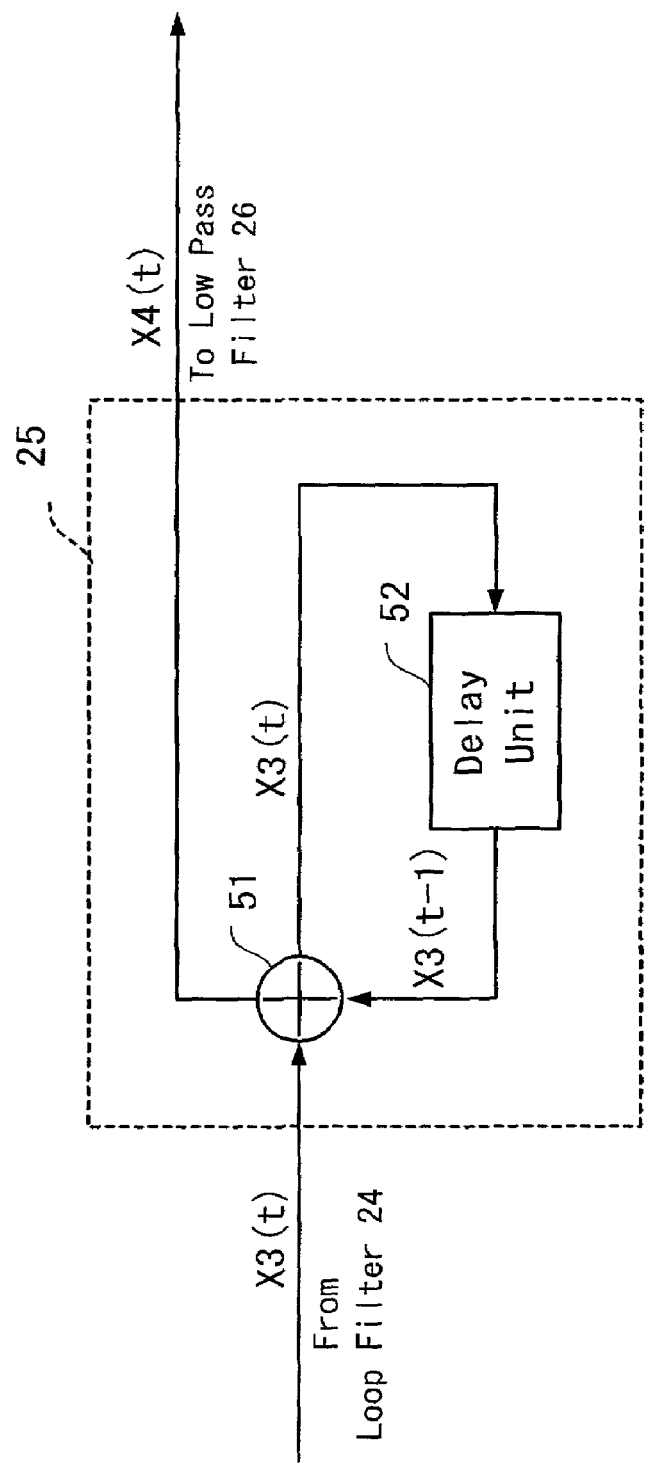
FIG. 29 is a block diagram showing the detailed structure of a PWM calculator 25 of FIG. 26.
Figure 30:
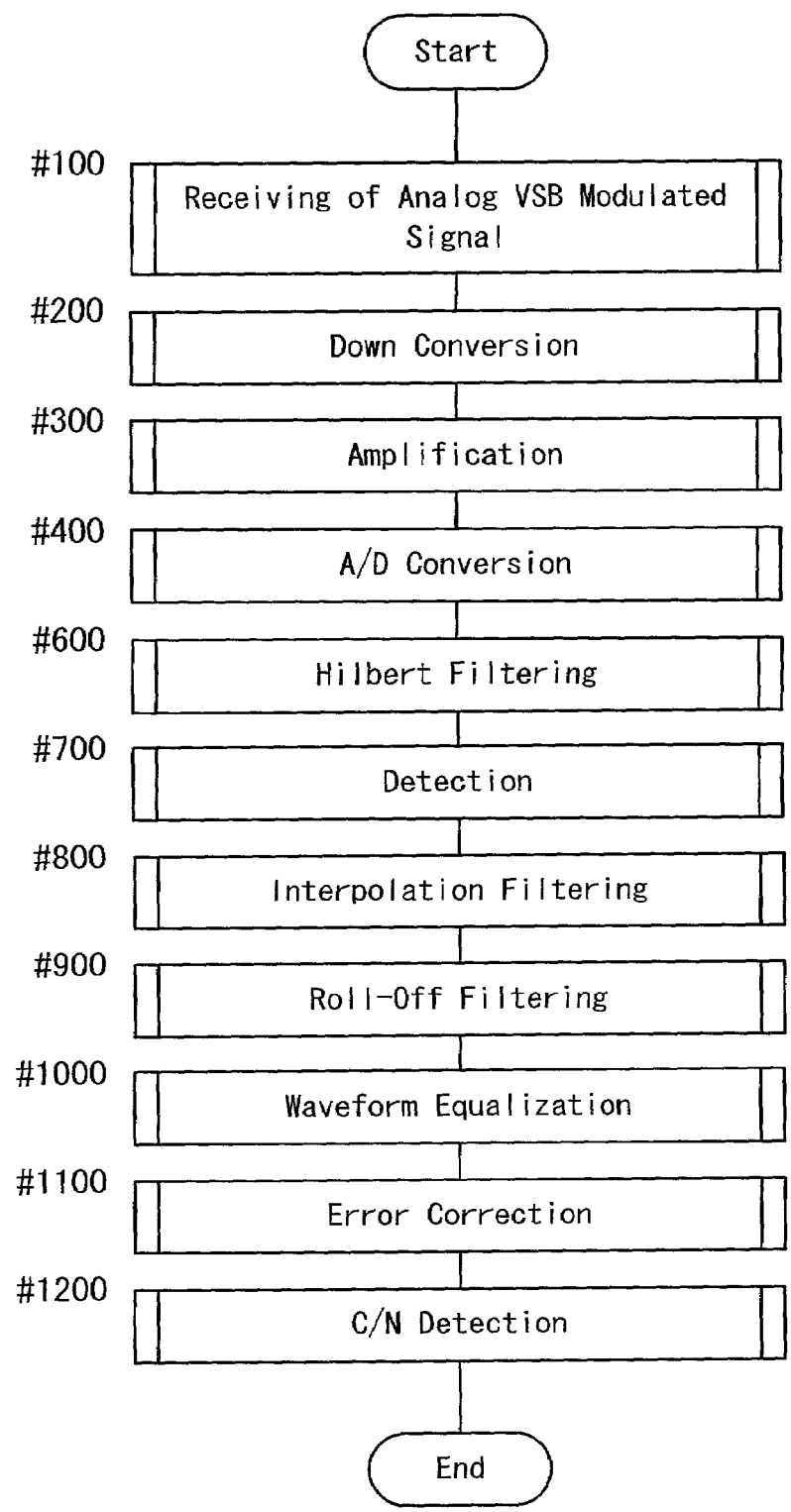
FIG. 30 is a flowchart showing the main operation of the VSB demodulation apparatus of FIG. 25.

With reference to FIG. 23, described in detail is the above step #500D, "detection of receive level variation based on C/N ratio and gain control by adaptive average-filtering" subroutine, which is mainly carried out by the adaptive AGC 15D. As is evident from the FIG. 23, step #550A, "detection and evaluation of receive level variation of the VSB modulated signal" subroutine, is replaced by step #550D, "detection and evaluation of receive level variation of the VSB modulated signal" subroutine based on the C/N ratio.

In step #550D includes steps S15, S18D, S20, and S22. In step S15, a C/N value is obtained based on the C/N signal Scn received from the C/N detector 1002. Then, in step S18D, the C/N value obtained in step S15 is compared with a threshold CNth. Then, in step S20 or S22, the averaging coefficient control signal Ssw is generated in the above described manner for output to the adaptive averaging filter 22A.

In step #500D, the process goes the same as the "gain control by adaptive average-filtering based on receive level variation" subroutine shown in FIG. 5, except that the averaging coefficient of the adaptive averaging filter 22A is set based on the averaging coefficient control signal Ssw.

As described above, the VSB demodulation apparatus according to the present invention detects receive level variation of the received VSB modulated signal wave Sb based on any one of the VSB modulated signal wave Sb itself, the digital VSB modulated signal, and C/N information of the VSB modulated signal. According to the detected receive level variation, internal parameters for automatic gain control are adjusted, thereby enabling digital decoding with high quality. The present invention has been exemplarily described as adapted to a VSB demodulation apparatus, which is one example of digital demodulation apparatuses. However, it is evident that the present invention can also be adapted to other digital demodulation apparatuses typified by OFDM demodulation apparatuses and QAM demodulation apparatuses.

While the invention has been described in detail, the foregoing description is in all aspects illustrative and not restrictive. It is understood that numerous other modifications and variations can be devised without departing from the scope of the invention.

The invention claimed is:

1. A digital demodulation apparatus for amplifying, for demodulation, a digital modulated signal wave received through the air with gain automatically controlled for generating a digital signal having a predetermined amplitude, the digital demodulation apparatus comprising:

receive level variation detection means for detecting receive level variation of the received digital modulated signal wave; and gain adjusting means for adjusting the gain based on the detected receive level variation, wherein said receive level variation detection means comprises:

tuning means for extracting a desired digital modulated signal from received digital modulated signal waves, and generating a first digital modulated signal;

automatic gain control amplification means for amplifying the first digital modulated signal with the gain, and generating a second digital modulated signal;

digitizing means for converting the second digital modulated signal into a third digital modulated signal; and tuned signal receive level variation detection means for detecting receive level variation of the first digital modulated signal based on an amplitude of the third digital modulated signal, said gain adjusting means adjusts the gain based on the detected receive level variation of the third digital modulated signal, said tuned signal receive level variation detection means comprises:

amplitude detection means for detecting an amplitude value of the third digital modulated signal;

average-filtering means for carrying out average-filtering on the detected amplitude value with a predetermined averaging coefficient to detect an average amplitude value;

error detection means for detecting an error between the detected average amplitude value and a desired average value;

loop filter means for carrying out loop filtering on the detected error with a predetermined integral coefficient, and generating a stabilization signal for stabilizing an automatic gain control amplification process; and difference detection means for detecting a difference between two arbitrary values of the stabilization signal, said tuned signal receive level variation detection means detects the receive level variation based on the generated stabilization signal, the receive level variation is detected based on a comparison result obtained by comparing the difference with a predetermined threshold, said tuned signal receive level variation detection means generates a level variation signal indicating the comparison result, and said gain adjusting means controls the gain based on the level variation signal, and said average-filtering means is an adaptive averaging filter for adaptively setting the predetermined averaging coefficient based on a value of the level variation signal, to enable digital signal demodulation with high quality by appropriately setting the predetermined averaging coefficient based on the detected receive level variation.

2. The digital demodulation apparatus according to claim 1, wherein said average-filtering means includes a first averaging coefficient and a second averaging coefficient larger than the first averaging coefficient, selects the first averaging coefficient as the predetermined averaging coefficient if the detected receive level variation in the level variation signal is smaller than the predetermined threshold, and selects the second averaging coefficient as the predetermined averaging coefficient if the detected receive level variation in the level variation signal is not smaller than the predetermined threshold.

3. A digital demodulation apparatus for amplifying, for demodulation, a digital modulated signal wave received through the air with gain automatically controlled for generating a digital signal having a predetermined amplitude, the digital demodulation apparatus comprising:

receive level variation detection means for detecting receive level variation of the received digital modulated signal wave; and gain adjusting means for adjusting the gain based on the detected receive level variation, wherein said receive level variation detection means comprises:

tuning means for extracting a desired digital modulated signal from received digital modulated signal waves, and generating a first digital modulated signal;

automatic gain control amplification means for amplifying the first digital modulated signal with the gain and generating a second digital modulated signal;

digitizing means for converting the second digital modulated signal into a third digital modulated signal; and tuned signal receive level variation detection means for detecting receive level variation of the first digital modulated signal based on an amplitude of the third digital modulated signal, said gain adjusting means adjusts the gain based on the detected receive level variation of the third digital modulated signal, said tuned signal receive level variation detection means comprises:

amplitude detection means for detecting an amplitude value of the third digital modulated signal;

average-filtering means for carrying out average-filtering on the detected amplitude value with a predetermined averaging coefficient to detect an average amplitude value;

error detection means for detecting an error between the detected average amplitude value and a desired average value; and loop filter means for carrying out loop filtering on the detected error with a predetermined integral coefficient, and generating a stabilization signal for stabilizing an automatic gain control amplification process; and difference detection means for detecting a difference between two arbitrary values of the stabilization signal, said tuned signal receive level variation detection means detects the receive level variation based on the Generated stabilization signal, the receive level variation is detected based on a comparison result obtained by comparing the difference with a predetermined threshold said tuned signal receive level variation detection means generates a level variation signal indicating the comparison result, and said gain adjusting means controls the gain based on the level variation signal, and said loop filtering means is an adaptive loop filter for adaptively setting the predetermined integral coefficient based on the level variation signal to enable digital signal demodulation with high quality by appropriately setting the predetermined integral coefficient based on the detected receive level variation.

4. The digital demodulation apparatus according to claim 3, wherein said loop filtering means includes a first integral coefficient and a second integral coefficient larger than the first integral coefficient, selects the first integral coefficient as the predetermined integral coefficient if the detected receive level variation in the level variation signal is smaller than the predetermined threshold, and selects the second integral coefficient as the predetermined integral coefficient if the detected receive level variation in the level variation signal is not smaller than the predetermined threshold.

5. A digital demodulation apparatus for amplifying for demodulation, a digital modulated signal wave received through the air with gain automatically controlled for generating a digital signal having a predetermined amplitude, the digital demodulation apparatus comprising:

receive level variation detection means for detecting receive level variation of the received digital modulated signal wave; and gain adjusting means for adjusting the gain based on the detected receive level variation, wherein said receive level variation detection means comprises:
tuning means for extracting a desired digital modulated signal from received digital modulated signal waves, and generating a first digital modulated signal;

automatic gain control amplification means for amplifying the first digital modulated signal with the gain, and generating a second digital modulated signal;

digitizing means for converting the second digital modulated signal into a third digital modulated signal; and tuned signal receive level variation detection means for detecting receive level variation of the first digital modulated signal based on an amplitude of the third digital modulated signal, and said gain adjusting means adjusts the gain based on the detected receive level variation of the third digital modulated signal;

said tuned signal receive level variation detection means comprises:

Hilbert filtering means for extracting quadrature components from the third digital modulated signal;

detection means for detecting and correcting an error between a frequency of the third digital modulated signal and an oscillation frequency of said tuning means, and frequency-converting the error-corrected third digital modulated signal into a baseband signal;

interpolation filtering means for converting the baseband signal into symbol-rate frequency data based on system-clock frequency data;

roll-off filtering means for extracting low-frequency components from the symbol-rate frequency data at a desired roll-off rate, and generating low-frequency, symbol-rate frequency data;

waveform equalizing means for eliminating distortion caused by a transmission path from the low-frequency, symbol-rate frequency data;

error correction means correcting an error caused by the transmission path and occurring in the waveform-equalized, low-frequency, symbol-rate frequency data; and error rate detection means for detecting an error rate of the third digital modulated signal, and based on the detected error rate, said receive level variation detection means detects the receive level variation.

6. The digital demodulation apparatus according to claim 5, wherein said tuned signal receive level variation detection means further comprises:

amplitude detection means for detecting an amplitude value of the third digital modulated signal;

average-filtering means for carrying out average-filtering on the detected amplitude value with a predetermined averaging coefficient to detect an average amplitude value;

error detection means for detecting an error between the detected average amplitude value and a desired average value; and loop filter means for carrying out loop filtering on the detected error with a predetermined integral coefficient, and generating a stabilization signal for stabilizing an automatic gain control amplification process, and said tuned signal receive level variation detection means detects the receive level variation based on a comparison result obtained by comparing the detected error rate with a predetermined threshold.

7. The digital demodulation apparatus according to claim 6, wherein said tuned signal receive level variation detection means generates a level variation signal indicating the comparison result, and said gain adjusting means adjusts the gain based on the level variation signal.

8. The digital demodulation apparatus according to claim 7, wherein said average-filtering means is an adaptive averaging filter for adaptively setting the predetermined averaging coefficient based on the level variation signal to enable digital signal demodulation with high quality by appropriately setting the predetermined averaging coefficient based on the detected receive level variation.

9. The digital demodulation apparatus according to claim 8, wherein said average-filtering means includes a first averaging coefficient and a second averaging coefficient larger than the first averaging coefficient, selects the first averaging coefficient as the predetermined averaging coefficient if the detected receive level variation in the level variation signal is smaller than the predetermined threshold, and selects the second averaging coefficient as the predetermined averaging coefficient if the detected receive level variation in the level variation signal is not smaller than the predetermined threshold.

10. The digital demodulation apparatus according to claim 7, wherein said loop filtering means is an adaptive loop filter for adaptively setting the predetermined integral coefficient based on the level variation signal to enable digital signal demodulation with high quality by appropriately setting the predetermined integral coefficient based on the detected receive level variation.

11. The digital demodulation apparatus according to claim 10, wherein said loop filtering means includes a first integral coefficient and a second integral coefficient larger than the first integral coefficient, selects the first integral coefficient as the predetermined integral coefficient if the detected receive level variation in the level variation signal is smaller than the predetermined threshold, and selects the second integral coefficient as the predetermined integral coefficient if the detected receive level variation in the level variation signal is not smaller than the predetermined threshold.

12. The digital demodulation apparatus according to claim 6, wherein said tuned signal receive level variation detection means further comprises:

PWM calculation means for converting the stabilization signal into a square-wave signal represented by 0 and 1;

low-pass-filtering means for extracting low-frequency components from the square-wave signal to generate a low-frequency, square-wave signal; and gain adjusting signal generation means for generating, based on the low-frequency, square-wave signal, a gain adjusting signal for adjusting gain of said automatic gain control amplification means, and said gain adjusting means adjusts the gain based on the gain adjusting signal.

13. A digital demodulation apparatus for amplifying for demodulation a digital modulated signal wave received through the air with gain automatically controlled for generating a digital signal having a predetermined amplitude, the digital demodulation apparatus comprising:

receive level variation detection means for detecting receive level variation of the received digital modulated signal wave; and gain adjusting means for adjusting the gain based on the detected receive level variation, wherein said receive level variation detection means comprises:

tuning means for extracting a desired digital modulated signal from received digital modulated signal waves, and generating a first digital modulated signal;

automatic gain control amplification means for amplifying the first digital modulated signal with the gain, and generating a second digital modulated signal;

digitizing means for converting the second digital modulated signal into a third digital modulated signal; and tuned signal receive level variation detection means for detecting receive level variation of the first digital modulated signal based on an amplitude of the third digital modulated signal, said gain adjusting means adjusts the gain based on the detected receive level variation of the third digital modulated signal, said tuned signal receive level variation detection means comprises:

amplitude detection means for detecting an amplitude value of the third digital modulated signal;

average-filtering means for carrying out average-filtering on the detected amplitude value with a predetermined averaging coefficient to detect an average amplitude value;

error detection means for detecting an error between the detected average amplitude value and a desired average value;

loop filter means for carrying out loop filtering on the detected error with a predetermined integral coefficient, and generating a stabilization signal for stabilizing an automatic gain control amplification process;

difference detection means for detecting a difference between two arbitrary values of the stabilization signal;

PWM calculation means for converting the stabilization signal into a square-wave signal represented by 0 and 1; and low-pass-filtering means for extracting low-frequency components from the square-wave signal to generate a low-frequency, square-wave signal, said tuned signal receive level variation detection means detects the receive level variation based on the generated stabilization signal, the receive level variation is detected based on a comparison result obtained by comparing the difference with a predetermined threshold, said tuned signal receive level variation detection means detects the receive level variation based on the low-frequency square-wave signal, said tuned signal receive level variation detection means generates a level variation signal indicating the comparison result, and said gain adjusting means adjusts the gain based on the level variation signal, and said average-filtering means is an adaptive averaging filter for adaptively setting the predetermined averaging coefficient based on a value of the level variation signal to enable digital signal demodulation with high quality by appropriately setting the predetermined averaging coefficient based on the detected receive level variation.

14. The digital demodulation apparatus according to claim 13, wherein said average-filtering means includes a first averaging coefficient and a second averaging coefficient larger than the first averaging coefficient, selects the first averaging coefficient as the predetermined averaging coefficient if the detected receive level variation in the level variation signal is smaller than the predetermined threshold, and selects the second averaging coefficient as the predetermined averaging coefficient if the detected receive level variation in the level variation signal is not smaller than the predetermined threshold.

15. A digital demodulation apparatus for amplifying, for demodulation, a digital modulated signal wave received through the air with gain automatically controlled for generating a digital signal having a predetermined amplitude, the digital demodulation apparatus comprising:
receive level variation detection means for detecting receive level variation of the received digital modulated signal wave; and
gain adjusting means for adjusting the gain based on the detected receive level variation, wherein
said receive level variation detection means comprises:
tuning means for extracting a desired digital modulated signal from received digital modulated signal waves, and generating a first digital modulated signal;
automatic gain control amplification means for amplifying the first digital modulated signal with the gain, and generating a second digital modulated signal;
digitizing means for converting the second digital modulated signal into a third digital modulated signal; and
tuned signal receive level variation detection means for detecting receive level variation of the first digital modulated signal based on an amplitude of the third digital modulated signal,
said gain adjusting means adjusts the gain based on the detected receive level variation of the third digital modulated signal,
said tuned signal receive level variation detection means comprises:
amplitude detection means for detecting an amplitude value of the third digital modulated signal;
average-filtering means for carrying out average-filtering on the detected amplitude value with a predetermined averaging coefficient to detect an average amplitude value;
error detection means for detecting an error between the detected average amplitude value and a desired average value;
loop filter means for carrying out loop filtering on the detected error with a predetermined integral coefficient, and generating a stabilization signal for stabilizing an automatic gain control amplification process;
difference detection means for detecting a difference between two arbitrary values of the stabilization signal;
PWM calculation means for converting the stabilization signal into a square-wave signal represented by 0 and 1; and
low-pass-filtering means for extracting low-frequency components from the square-wave signal to generate a low-frequency, square-wave signal,
said tuned signal receive level variation detection means detects the receive level variation based on the generated stabilization signal,
the receive level variation is detected based on a comparison result obtained by comparing the difference with a predetermined threshold,
said tuned signal receive level variation detection means detects the receive level variation based on the low-frequency, square-wave signal,
said tuned signal receive level variation detection means generates a level variation signal indicating the comparison result, and said gain adjusting means adjusts the gain based on the level variation signal, and
said loop filtering means is an adaptive averaging filter for adaptively settings the predetermined integral coefficient based on the level variation signal to enable digital signal demodulation with high quality by appropriately setting the predetermined integral coefficient based on the detected receive level variation.

16. The digital demodulation apparatus according to claim 15, wherein
said loop filtering means includes a first integral coefficient and a second integral coefficient larger than the first integral coefficient, selects the first integral coefficient as the predetermined integral coefficient if the detected receive level variation in the level variation signal is smaller than the predetermined threshold, and selects the second integral coefficient as the predetermined integral coefficient if the detected receive level variation in the level variation signal is not smaller than the predetermined threshold.

17. An automatic gain controller that controls for controlling gain of a digital demodulation apparatus that extracts a digital modulated signal of a desired frequency from digital modulated signal waves received through the air and generates a first digital modulated signal; carries out, for amplification, automatic-gain-controlling on the first digital modulated signal with predetermined gain and generating a second digital modulated signal having a desired amplitude value; and digitizes the second digital modulated signal into a third digital modulated signal, the automatic gain controller comprising:
amplitude detection means for detecting the amplitude value of the third digital modulated signal;
average-filtering means for carrying out average-filtering on the detected amplitude value with a predetermined averaging coefficient, and detecting an average amplitude value;
error detection means for detecting an error between the detected average amplitudes value and a desired average value;
loop filtering means for carrying out loop filtering on the detected error with a predetermined integral coefficient, and generating a stabilization signal for stabilizing an automatic gain control amplification process;
receive level variation detection means for detecting a receive level variation based on the generated stabilization signal; and
average coefficient adjustment means for varying the predetermined average coefficient of said average-filtering means based on the detected receive level variation, wherein
said average-filtering means is an adaptive averaging filter for adaptively setting the predetermined averaging coefficient based on a value of a level variation signal, to enable digital signal demodulation with high quality by appropriately setting the predetermined averaging coefficient based on the detected receive level variation.

18. An automatic gain controller for controlling gain of a digital demodulation apparatus that extracts a digital modulated signal of a desired frequency from digital modulated signal waves received through the air and generates a first digital modulated signal; carries out, for amplification, automatic-gain-controlling on the first digital modulated signal with predetermined gain and generates a second digital modulated signal having a desired amplitude value; and converts the second digital modulated signal into a third digital modulated signal, the automatic gain controller comprising:
amplitude detection means for detecting an amplitude value of the third digital modulated signal;

average-filtering means for carrying out average-filtering on the detected amplitude value with a predetermined averaging coefficient, and detecting an average amplitude value;

error detection means for detecting an error between the detected average amplitude value and a desired average value;

loop filtering means for carrying out loop filtering on the detected error with a predetermined integral coefficient, and generating a stabilization signal for stabilizing an automatic gain control amplification process;

receive level variation detection means for detecting a receive level variation based on the detected stabilization signal; and integral coefficient adjusting means for varying the predetermined integral coefficient of said loop filtering means based on the detected receive level variation, wherein said loop filtering means is an adaptive loop filter for adaptively setting the predetermined integral coefficient based on a level variation signal to enable digital signal demodulation with high quality by appropriately setting the predetermined integral coefficient based on the detected receive level variation.

19. An automatic gain controller for controlling gain of a digital demodulation apparatus that extracts a digital modulated signal of a desired frequency from digital modulated signal waves received through the air and generates a first digital modulated signal; carries out, for amplification, automatic-gain-controlling on the first digital modulated signal with predetermined gain and generates a second digital modulated signal having a desired amplitude value; and converts the second digital modulated signal into a third digital modulated signal, the automatic gain controller comprising:

amplitude detection means for detecting an amplitude value of the third digital modulated signal;

average-filtering means for carrying out average-filtering on the detected amplitude value with a predetermined averaging coefficient, and detecting an average amplitude value;

error detection means for detecting an error between the detected average amplitude value and a desired average value;

loop filtering means for carrying out loop filtering on the detected error with a predetermined integral coefficient, and generating a stabilization signal for stabilizing an automatic gain control amplification process;

receive level variation detection means for detecting a receive level variation based on an amplitude of the received digital modulated signal wave; and average coefficient adjusting means for varying the predetermined averaging coefficient of said average-filtering means based on the detected receive level variation, wherein said average-filtering means is an adaptive averaging filter for adaptively setting the predetermined averaging coefficient based on a value of a level variation signal, to enable digital signal demodulation with high quality by appropriately setting the predetermined averaging coefficient based on the detected receive level variation.

20. An automatic gain controller for controlling gain of a digital demodulation apparatus that extracts a digital modulated signal of a desired frequency from digital modulated signal waves received through the air and generates a first digital modulated signal; carries out, for amplification, automatic-gain-controlling on the first digital modulated signal with predetermined gain and generates a second digital modulated signal having a desired amplitude value; and converts the second digital modulated signal into a third digital modulated signal, the automatic gain controller comprising:

amplitude detection means for detecting an amplitude value of the third digital modulated signal;

average-filtering means for carrying out average-filtering on the detected amplitude value with a predetermined averaging coefficient, and detecting an average amplitude value;

error detection means for detecting an error between the detected average amplitude value and a desired average value;

loop filtering means for carrying out loop filtering on the detected error with a predetermined integral coefficient, and generating a stabilization signal for stabilizing an automatic gain control amplification process;

receive level variation detection means for detecting a receive level variation based on an amplitude of the received digital modulated signal wave; and integral coefficient adjusting means for varying the predetermined integral coefficient of said loop filtering means based on the detected receive level variation, wherein said loop filtering means is an adaptive loop filter for adaptively setting the predetermined integral coefficient based on a level variation signal to enable digital signal demodulation with high quality by appropriately setting the predetermined integral coefficient based on the detected receive level variation.

* * * * *